United States Patent
Tanaka et al.

(10) Patent No.: US 10,535,843 B2
(45) Date of Patent: Jan. 14, 2020

(54) METHOD FOR PRODUCING THIN-FILM ELEMENT DEVICE AND LIGHT IRRADIATION DEVICE USED THEREFOR

(71) Applicant: Sharp Kabushiki Kaisha, Sakai, Osaka (JP)

(72) Inventors: Tetsunori Tanaka, Sakai (JP); Wataru Nakamura, Sakai (JP); Shoji Okazaki, Sakai (JP); Masaki Fujiwara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 86 days.

(21) Appl. No.: 15/556,351

(22) PCT Filed: Mar. 3, 2016

(86) PCT No.: PCT/JP2016/001182
§ 371 (c)(1),
(2) Date: Sep. 7, 2017

(87) PCT Pub. No.: WO2016/143316
PCT Pub. Date: Sep. 15, 2016

(65) Prior Publication Data
US 2018/0108874 A1 Apr. 19, 2018

(30) Foreign Application Priority Data
Mar. 10, 2015 (JP) .................................. 2015-046694

(51) Int. Cl.
*H01L 21/00* (2006.01)
*H01L 51/56* (2006.01)
(Continued)

(52) U.S. Cl.
CPC ............ *H01L 51/56* (2013.01); *B23K 26/064* (2015.10); *B23K 26/57* (2015.10); *H01L 21/02* (2013.01);
(Continued)

(58) Field of Classification Search
CPC ..... H01L 21/02; H01L 27/12; H01L 27/1214; H01L 27/1266; H01L 27/3244;
(Continued)

(56) References Cited

U.S. PATENT DOCUMENTS

| 6,521,511 B1 * | 2/2003 | Inoue .................. H01L 21/2007 438/458 |
| 2003/0131788 A1 * | 7/2003 | Ueda .................... H01L 21/0237 117/108 |

(Continued)

FOREIGN PATENT DOCUMENTS

| CN | 104275555 A | 1/2015 |
| JP | 2008-244188 A | 10/2008 |

(Continued)

OTHER PUBLICATIONS

Official Communication issued in International Patent Application No. PCT/JP2016/001182, dated May 24, 2016.

*Primary Examiner* — Brook Kebede
(74) *Attorney, Agent, or Firm* — Keating & Bennett, LLP

(57) ABSTRACT

A method includes steps of (a) forming a substrate layer 10 above a support substrate 8 which is transparent, and then a thin-film element above the substrate layer 10; and (b) emitting laser beams La and Lb to a face of the support substrate 8 opposite to another face of the support substrate to which the substrate layer 10 and the thin-film element are formed, and delaminating the substrate layer 10 and the
(Continued)

thin-film element from the support substrate 8. In step (b), the laser beams La and Lb are emitted from different directions.

18 Claims, 25 Drawing Sheets

(51) Int. Cl.
  *B23K 26/57* (2014.01)
  *H01L 51/00* (2006.01)
  *H01L 27/12* (2006.01)
  *H05B 33/10* (2006.01)
  *H01L 21/02* (2006.01)
  *B23K 26/064* (2014.01)
  *H01L 51/50* (2006.01)
  *B23K 101/36* (2006.01)

(52) U.S. Cl.
  CPC ........ *H01L 27/1266* (2013.01); *H01L 51/003* (2013.01); *H01L 51/5012* (2013.01); *H05B 33/10* (2013.01); *B23K 2101/36* (2018.08); *H01L 2251/56* (2013.01)

(58) Field of Classification Search
  CPC . H01L 27/3276; H01L 51/0013; H01L 51/50; H01L 51/501; H01L 51/5253; H01L 51/56
  USPC .................................. 438/34, 479, 455–459
  See application file for complete search history.

(56) References Cited

U.S. PATENT DOCUMENTS

2004/0245924 A1* 12/2004 Utsunomiya ....... H01L 27/1214
                                                          313/506
2009/0141615 A1*  6/2009 Nakai ................ G11B 7/24079
                                                         369/112.23

FOREIGN PATENT DOCUMENTS

JP       2009-248126 A    10/2009
JP       2013-026433 A     2/2013
WO       2015/151658 A1   10/2015

* cited by examiner

METHOD FOR PRODUCING THIN-FILM ELEMENT DEVICE AND LIGHT IRRADIATION DEVICE USED THEREFOR

TECHNICAL FIELD

The present invention relates to a method for producing a thin-film element device and a light irradiation device used therefore.

BACKGROUND ART

A method recently proposed for producing a thin-film element device involves: forming a separation layer above a transparent support substrate such as a glass substrate; forming a thin-film element such as a substrate layer and an organic electroluminescence (EL) element above the separation layer; and then emitting a laser beam onto the support substrate so that adhesion at an interface between the separation layer and the substrate layer is reduced and the substrate layer and the thin-film element are delaminated from the support substrate.

For example, PATENT DOCUMENT 1 discloses a method for delaminating a transferred layer, provided above a substrate via a separation layer, from the substrate. In this method, when the separation layer is irradiated with a laser beam for multiple times so that the transferred layer is removed from the substrate, a unit area to be irradiated with the laser beam is shaped into a substantial regular hexagon.

CITATION LIST

Patent Documents

PATENT DOCUMENT 1: Japanese Unexamined Patent Publication No. 2008-244188

SUMMARY OF THE INVENTION

Technical Problem

In the above thin-film element device production method in which the thin-film element device is delaminated from the support substrate with emission of the laser beam, the laser beam is inevitably blocked by such faults as an extraneous matter and a scratch on a surface (a back face), of the support substrate, to be irradiated with the laser beam. In a portion having such an extraneous matter and a scratch, energy of the laser beam is not sufficiently supplied to the separation layer. As a result, delamination of the thin-film element device is partially faulty such that a portion of the thin-film element device is left on the support substrate. Here, during a production process of the thin-film element device, the back face, of the support substrate, to be irradiated with the laser beam makes contact with, for example, a roller of a substrate transport apparatus and a stage surface of a processing apparatus. Such a contact would be a cause of a stain, a slight scratch, and chemical to be left on the back face of the support substrate.

The present invention is conceived in view of the above problems, and attempts to reduce faulty delamination of a thin-film element device.

Solution to the Problem

In order to carry out the above attempt, a method for producing a thin-film element device includes steps of: (a) forming a substrate layer above a support substrate which is transparent, and then a thin-film element above the substrate layer; and (b) emitting a laser beam to a face of the support substrate opposite to another face of the support substrate to which the substrate layer and the thin-film element are formed, and delaminating the substrate layer and the thin-film element from the support substrate, wherein in step (b), the laser beam is emitted from different directions.

Moreover, a light irradiation device according to the present invention includes: an emitting head emitting a laser beam to the irradiation substrate, wherein the stage or the emitting head allows the irradiation substrate to be irradiated with the laser beam from different directions.

Advantages of the Invention

The present invention involves emitting a laser beam from different directions, contributing to reducing faulty delamination of a thin-film element device.

DETAILED DESCRIPTION

Embodiments of the present invention will be described in detail below, with reference to the drawings. Note that the present invention is not limited to the following embodiments.

First Embodiment

Figure 1:
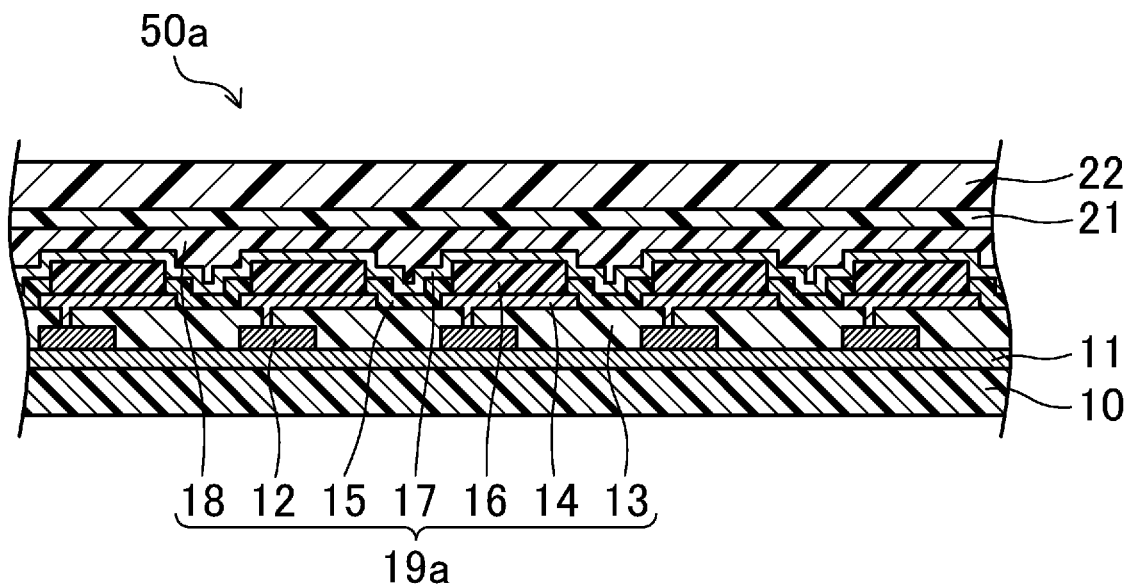
FIG. 1 is a cross-sectional view of an organic EL display according to a first embodiment of the present invention.
Figure 2:
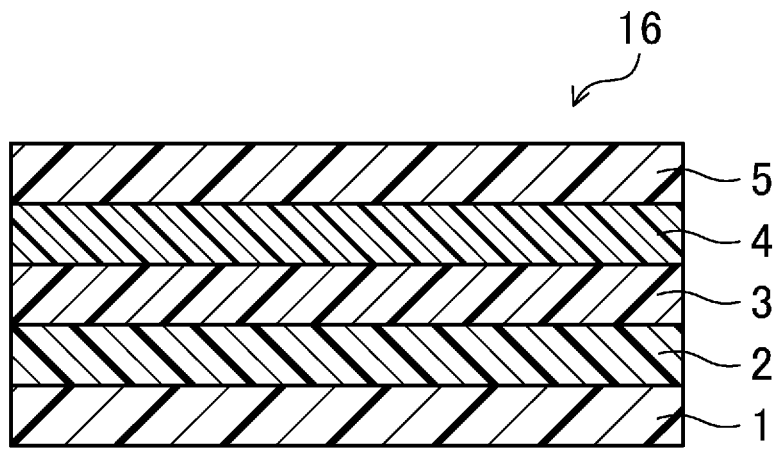
FIG. 2 is a cross-sectional view of an organic EL layer included in the organic EL display device according to the first embodiment of the present invention.

FIGS. 1 to 17 illustrate a first embodiment of a method for producing a thin-film element device according to the present invention, and a light irradiation device to be used in the method. Note that, in this embodiment, a method for producing an organic EL display device is described as an example of the method for producing a thin-film element device, and a laser beam emitting apparatus is described as an example of the light irradiation device to be used for the method. Here, FIG. 1 is a cross-sectional view of an organic EL display device 50a according to this embodiment. FIG. 2 is a cross-sectional view of an organic EL layer 16 included in the organic EL display panel 50a.

As illustrated in FIG. 1, the organic EL display device 50a includes: a resin substrate layer 10; a base coat layer 11 provided above the resin substrate layer 10; an organic EL element 19a provided above the base coat layer 11; and a support 22 provided above the organic EL element 19a via an adhesive layer 21. Here, in the organic EL display device 50a, a display region to display images is defined in a rectangular shape, and multiple pixels are arranged in a matrix in the display region. For example, each pixel includes sub-pixels arranged adjacent to each other. The sub-pixels include a sub-pixel for gradation display in red, a sub-pixel for gradation display in green, and a sub-pixel for gradation display in blue.

Here, the resin substrate layer 10 contains, for example, a heat-resistant and transparent resin material such as polyimide resin.

The base coat layer 11 is, for example, an inorganic insulating film such as a silicon oxide film and a silicon nitride film.

The organic EL element 19a includes: multiple thin-film transistors (TFTs) 12; an interlayer insulation film 13; multiple first electrodes 14; an edge cover 15; multiple organic EL layers 16; a second electrode 17; and a sealing film 18 which are provided over the base coat layer 11 in the stated order.

As illustrated in FIG. 1, each of the TFTs 12 is a switching element provided above the base coat layer 11 for an associated one of the sub-pixels. Here, each TFT 12 includes, for example: a gate electrode provided above the base coat layer 11; a gate insulating film covering the gate electrode; a semiconductor layer provided above the gate insulating layer and overlapping with the gate electrode; and source and drain electrodes provided above the semiconductor layer and facing each other. Note that although each TFT 12 is configured as a bottom gate TFT as an example in this embodiment, each TFT 12 may be configured as a top gate TFT.

As illustrated in FIG. 1, the interlayer insulating film 13 covers each TFT 12, except for a portion of the drain electrode of the TFT 12. Here, the interlayer insulating film 13 contains, for example, a transparent organic resin material such as acrylic resin.

Figure 14:
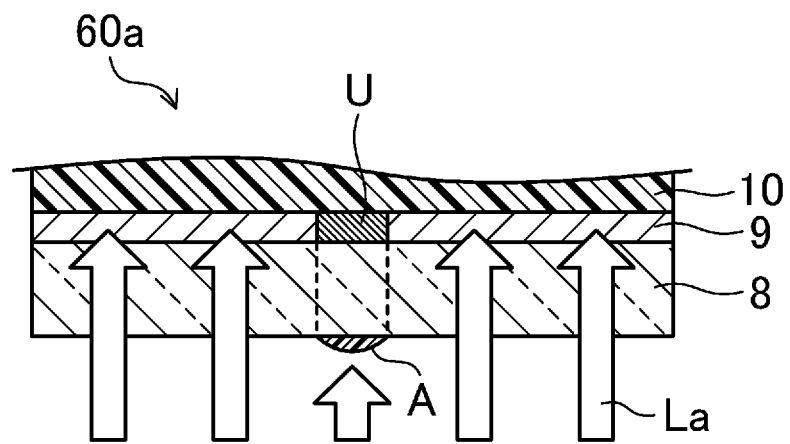
FIG. 14 is a first cross-sectional view illustrating an effect of the method for producing the organic EL display device according to the first embodiment of the present invention.

As illustrated in FIG. 14, the first electrodes 14 are arranged in a matrix above the interlayer insulating film 13 such that each first electrode 14 corresponds to an associated one of the sub-pixels. Here, as illustrated in FIG. 1, the first electrodes 14 are connected to the corresponding drain electrodes of the TFTs 12 via contact holes formed in the interlayer insulating film 13. The first electrodes 14 have a function of injecting holes (positive holes) into the organic EL layers 16. To increase the efficiency in injecting positive holes into the organic EL layers 16, the first electrodes 14 beneficially contain a material having a high work function. Examples of materials for the first electrodes 14 include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The first electrodes 14 may also contain an alloy of, for example, magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), or lithium fluoride (LiF)/calcium (Ca)/aluminum (Al). Furthermore, the material for the first electrodes 14 may also be a conductive oxide such as tin oxide (SnO), zinc oxide (ZnO), indium tin oxide (ITO), and indium zinc oxide (IZO), for example. Moreover, the first electrodes 14 may be multilayers containing the above materials. Examples of materials having a high work function include indium tin oxide (ITO) and indium zinc oxide (IZO).

As illustrated in FIG. 1, the edge cover 15 is formed in a grid pattern to cover a peripheral portion of each first electrode 14. Examples of materials for the edge cover 15 include an inorganic film of silicon dioxide ($SiO_2$), silicon nitride (SiNx, where x is a positive number) such as $Si_3N_4$ and silicon oxynitride (SiNO), or an organic film of polyimide resin, acrylic resin, polysiloxane resin, and novolak resin.

As illustrated in FIG. 1, the organic EL layers 16 are each provided above an associated one of the first electrodes 14, and are arranged in a matrix so as to correspond to the sub-pixels. Here, as shown in FIG. 2, each organic EL layer 16 includes a positive hole injection layer 1, a positive hole transport layer 2, a light-emitting layer 3, an electron transport layer 4, and an electron injection layer 5, which are provided over the associated first electrode 14 in the stated order.

The positive hole injection layer 1 is also called an anode buffer layer, and has a function of bringing the energy levels of the first electrodes 14 and the organic EL layers 16 closer to each other and increasing efficiency in injection of positive holes from the first electrodes 14 into the organic EL layers 16. Here, examples of materials for the positive hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The positive hole transport layer 2 has a function of increasing an efficiency in transportation of positive holes from the first electrodes 14 to the organic EL layers 16. Here, examples of materials for the positive hole transport layer 2 include porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

When a voltage is applied from the first electrodes 14 and the second electrode 17, positive holes and electrons are injected from the first and second electrodes 14 and 17 into the light-emitting layer 3, in which the positive holes and the electrons are recombined with each other. This light-emitting layer 3 contains a material having high luminous efficiency. Examples of materials for the light-emitting layer 3 include metal oxinoid compounds (8-hydroxyquinoline metal complexes), naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bis(styryl) benzene derivatives, tris(styryl)benzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, and polysilane.

The electron transport layer 4 functions to efficiently move electrons to the light-emitting layer 3. Here, examples of materials for the electron transport layer 4 includes, as organic compounds, oxadiazole derivatives, triazole derivatives, benzoquinone derivatives, naphthoquinone derivatives, anthraquinone derivatives, tetracyanoanthraquinodimethan derivatives, diphenoquinone derivatives, fluorenone derivatives, silole derivatives, and metal oxinoid compounds.

The electron injection layer 5 has a function of bringing the energy levels of the second electrode 17 and the organic EL layers 16 close to each other and increasing efficiency in injection of electron from the second electrode 17 into the organic EL layers 16. This function contributes to reduction in the drive voltage of the organic EL element 18. The electron injection layer 5 may also be called a cathode buffer layer. Here, examples of materials for the electron injection layer 5 include inorganic alkaline compounds such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 1, the second electrode 17 covers the organic EL layers 16 and the edge cover 15. The second electrode 17 has a function of injecting electrons into the organic EL layers 16. To increase efficiency in injecting electrons into the organic EL layers 16, the second electrode 17 beneficially contains a material having a low work function. Here, examples of materials for the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 17 may also contain, for example, an alloy of magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), and lithium fluoride (LiF)/calcium (Ca)/aluminum (Al). The second electrode 17 may also contain, for example, a conductive oxide such as tin oxide (SnO), zinc oxide (ZnO), indium tin oxide (ITO), and indium zinc oxide (IZO). Moreover, the second electrode 17 may be multilayers containing the above materials. Examples of material having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 1, the sealing film 18 covers a stack of the first electrodes 14, the edge cover 15, the organic EL layers 16, and the second electrode 17. The sealing film 18 has a function of protecting the organic EL element 16 against moisture and oxygen. Here, examples of materials for the sealing film 18 include inorganic materials such as silicon dioxide ($SiO_2$), aluminum oxide ($Al_2O_3$), silicon nitride (SiNx, where x is a positive number) such as $Si_3N_4$, and silicon carbonitride (SiCN), and organic materials such as acrylate, polyurea, parylene, polyimide, and polyamide.

The adhesive layer 21 contains, for example, thermoset adhesive or ultraviolet cure adhesive such as acrylic, epoxy, and silicone adhesive.

The support 22 contains, for example, a flexible synthetic resin film such as polyethylene terephthalate, polyethylene naphthalate, and aramid.

The above organic EL display device 50a is flexible, and displays an image when the light-emitting layer 3 of the organic EL layer 16 appropriately emits light in each sub-pixel via the TFT 12.

Figure 3:
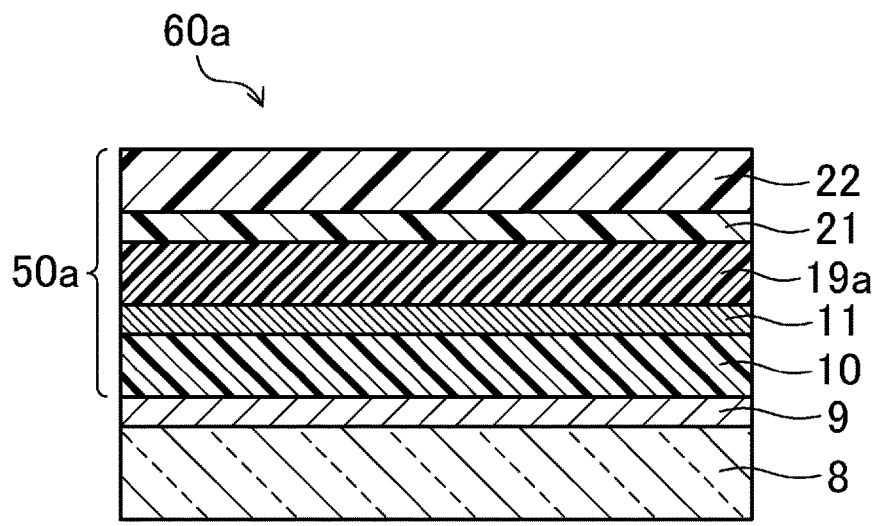
FIG. 3 is a cross-sectional view of an irradiation substrate to be prepared for producing the organic EL display device according to the first embodiment of the present invention.
Figure 4:
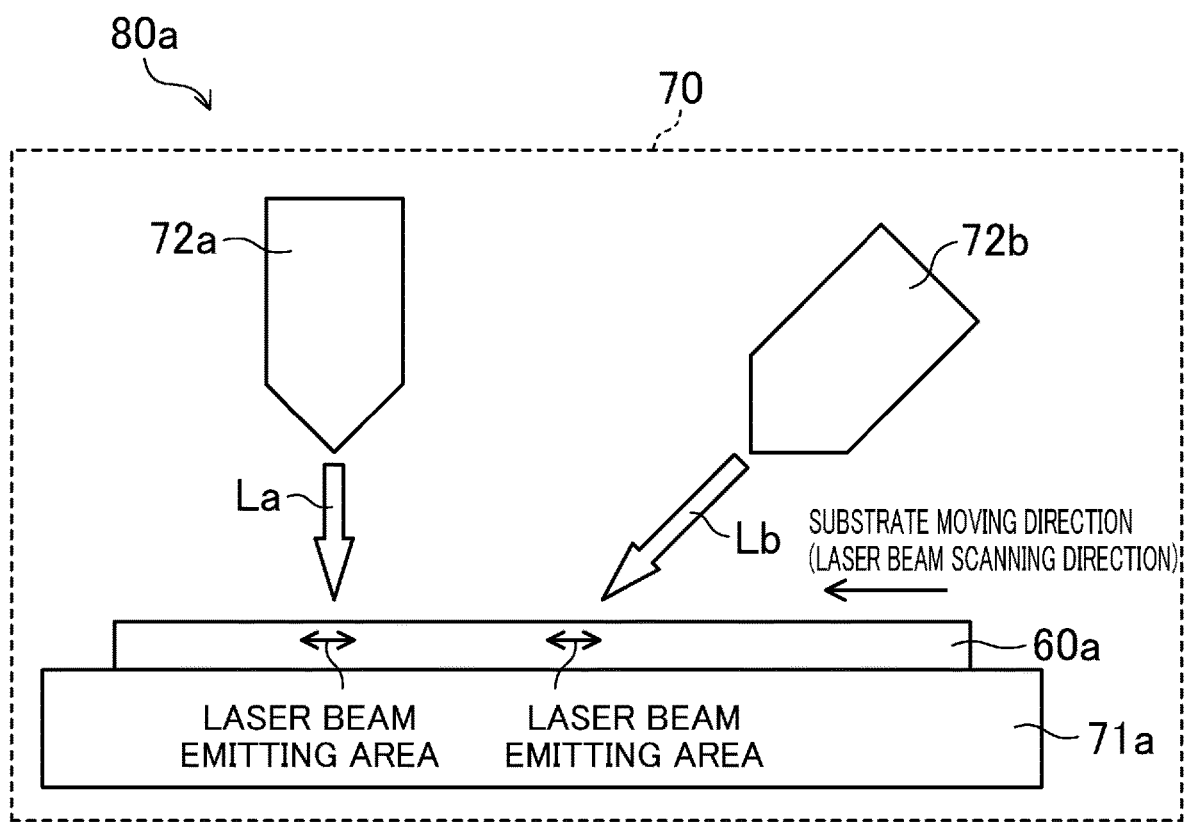
FIG. 4 is a lateral view illustrating a light irradiation device to be used for a method for producing the organic EL display device according to the first embodiment of the present invention.
Figure 5:
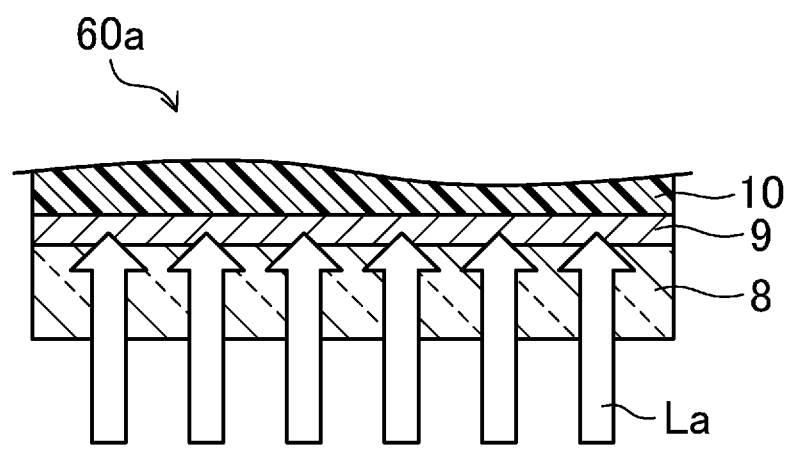
FIG. 5 is a first cross-sectional view illustrating the method for producing the organic EL display device according to the first embodiment of the present invention.
Figure 6:
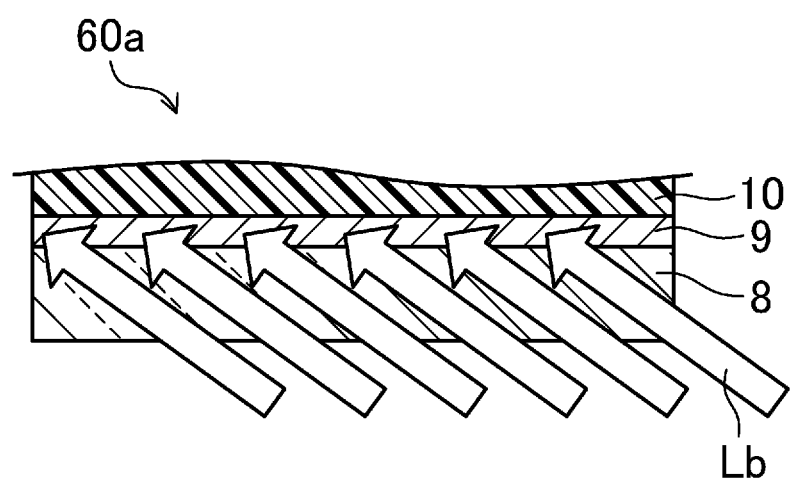
FIG. 6 is a second cross-sectional view illustrating the method for producing the organic EL display device according to the first embodiment of the present invention.
Figure 7:
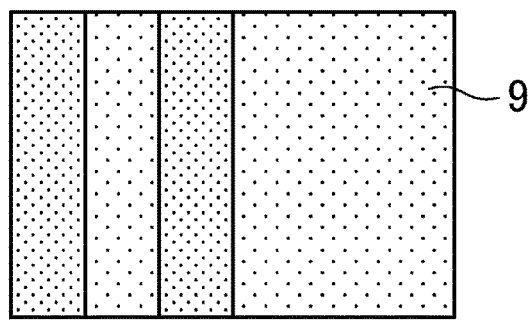
FIG. 7 is a plan view illustrating a method for emitting a laser beam in the method for producing the organic EL display device according to the first embodiment of the present invention.
Figure 8:
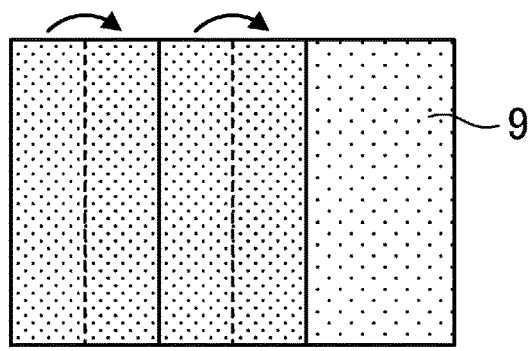
FIG. 8 is a plan view illustrating the method for emitting the laser beam in the method for producing the organic EL display device according to the first embodiment of the present invention.
Figure 9:
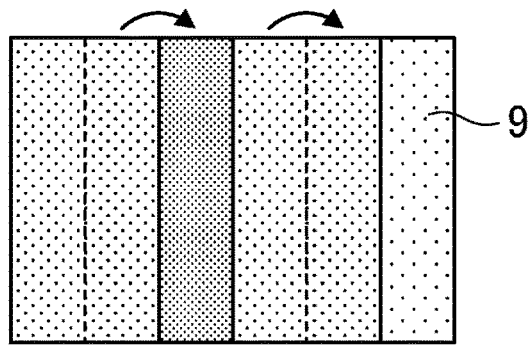
FIG. 9 is a plan view illustrating the method for emitting the laser beam in the method for producing the organic EL display device according to the first embodiment of the present invention.
Figure 10:
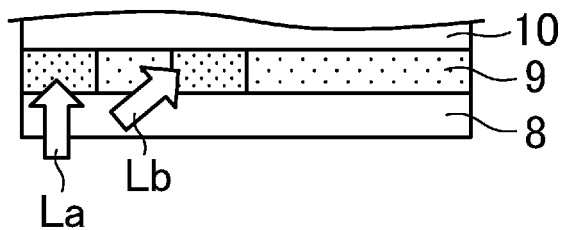
FIG. 10 is a cross-sectional view illustrating the method for emitting the laser beam in the method for producing the organic EL display device according to the first embodiment of the present invention.
Figure 11:
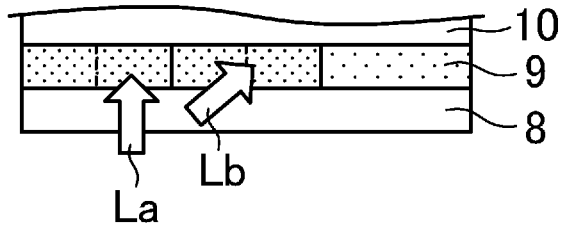
FIG. 11 is a cross-sectional view illustrating the method for emitting the laser beam in the method for producing the organic EL display device according to the first embodiment of the present invention.
Figure 12:
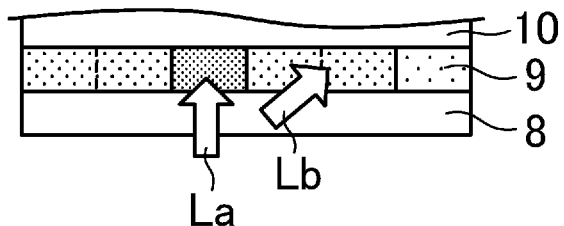
FIG. 12 is a cross-sectional view illustrating the method for emitting the laser beam in the method for producing the organic EL display device according to the first embodiment of the present invention.
Figure 13:
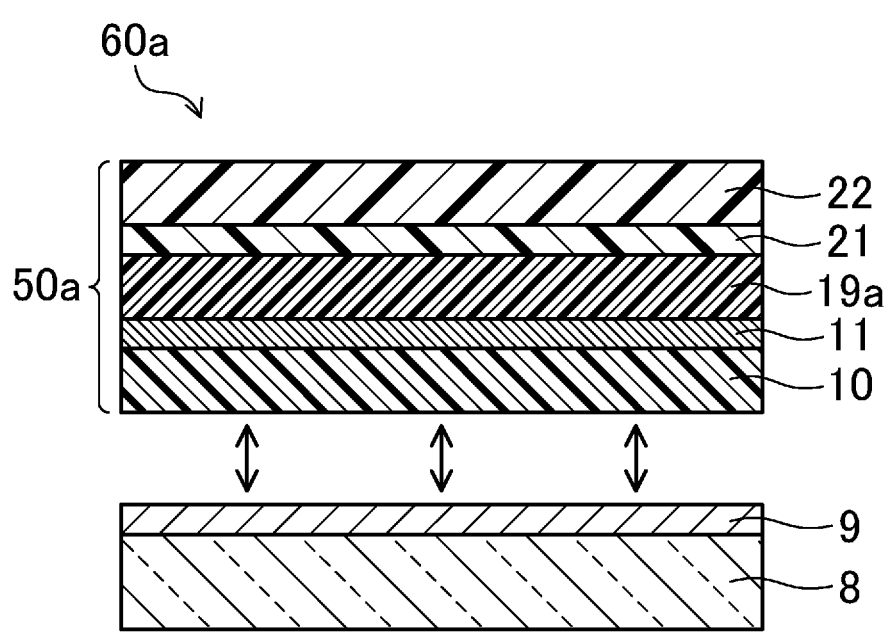
FIG. 13 is a third cross-sectional view illustrating the method for producing the organic EL display device according to the first embodiment of the present invention.
Figure 15:
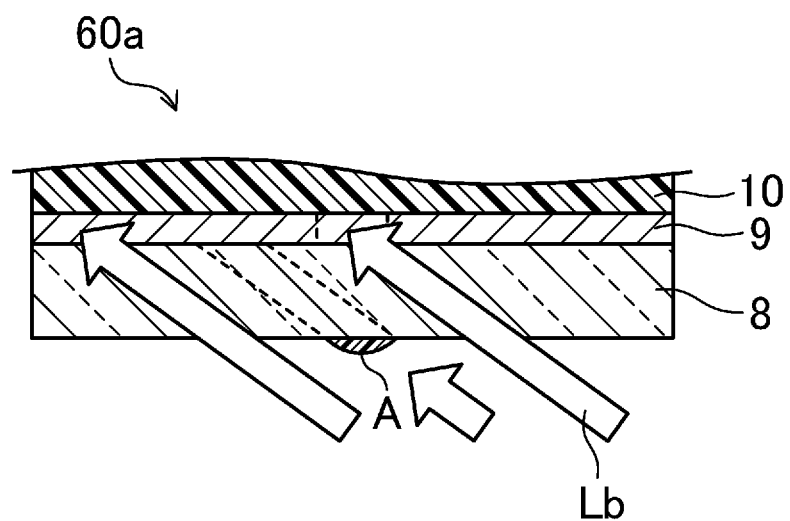
FIG. 15 is a second cross-sectional view illustrating an effect of the method for producing the organic EL display device according to the first embodiment of the present invention.

Described next is a method for producing the organic EL display device 50a according to this embodiment. FIG. 3 is a cross-sectional view of an irradiation substrate 60a to be prepared for producing the organic EL display device 50a. FIG. 4 is a lateral view illustrating a light irradiation device 80a to be used for the method for producing the organic EL display 50a. FIGS. 5, 6, and 13 are the first, second, and third cross-sectional views illustrating the method for producing the organic EL display device 50a. FIGS. 7 to 12 are plan views and cross-sectional views illustrating a method for emitting laser beams La and Lb in the method for producing the organic EL display device 50a. FIGS. 14 and 15 are the first and second cross-sectional views illustrating an effect of the method for producing the organic EL display 50a. FIGS.

16 and 17 are the first and second cross-sectional views illustrating an incident angle θ of the laser beam Lb in the method for producing the organic EL display 50a. Note that the method for manufacturing the organic EL display device 50a of this embodiment includes forming an element and delaminating the element.

<Forming Element>

First, as illustrated in FIG. 3, a separation layer 9, having a thickness ranging approximately from 100 nm to 300 nm, is formed on a surface of the support substrate 8 such as a glass substrate. An example of the separation layer 9 is either (i) one of a metal film containing molybdenum (Mo), tantalum (Ta), tungsten (W), or titan (Ti), an alloy film, an oxide film, or a nitride film containing these metals and deposited by sputtering, or (ii) an amorphous silicon film deposited by chemical vapor deposition (CVD).

Then, polyimide resin is applied on a surface of the separation layer 9 by, for example, spin coating or slit coating. After that, a film of the applied polyimide resin is baked to form a resin substrate layer 10 having a thickness ranging approximately from 5 μm to 20 μm as illustrated in FIG. 3.

Furthermore, a film such as a silicon oxide film or a silicon nitride film, having a thickness ranging approximately from 50 nm to 1000 nm, is deposited on a surface of the resin substrate layer 10 by, for example, CVD to form a base coat layer 11 as illustrated in FIG. 3.

After that, the TFTs 12, the interlayer insulation film 13, the first electrodes 14, the edge cover 15, the organic EL layers 16 (each including the positive hole injection layer 1, the positive hole transport layer 2, the light-emitting layer 3, the electron transport layer 4, and the electron injection layer 5), the second electrode 17, and the sealing film 18 are formed on a surface of the base coat layer 11, using a well-known technique to form the organic EL element 19a as illustrated in FIG. 3.

Moreover, either thermoset or ultraviolet cure adhesive is applied on a surface of the sealing film 18 by, for example, spin coating or slit coating. After that, a flexible synthetic resin film containing polyethylene terephthalate, polyethylene naphthalate, or aramid is provided on a surface of the applied adhesive, and the applied adhesive is cured. Thus, as illustrated in FIG. 3, the support 22 is attached to a surface of the sealing film 18 via the adhesive layer 21. Note that this embodiment describes as an example a production method in which the adhesive is applied to the surface of the sealing film 18 so that the support 22 bonds to the sealing film 18. Instead, film adhesive may be attached to the surface of the sealing film 18, and the support 22 is attached to the surface.

In this manner, the irradiation substrate 60a (see FIG. 3) may be prepared.

<Delaminating Element>

Described here is the light irradiation device 80a to be used in delaminating an element.

As illustrated in FIG. 4, the light irradiation device 80a includes: a processing room 70 having a substantially sealed space therein; a stage 71a, an emitting head 72a, and an emitting head 72b provided in the processing room 70; and a laser source (not shown) supplying the emitting head 72a with the laser beam La and the emitting head 72b with the laser beam Lb via an optical fiber cable. Here, examples of the laser source include an XeF excimer laser (having a wavelength of 351 nm), an XeCl excimer laser (having a wavelength of 308 nm), and a YVO$_4$ solid-state laser (having a wavelength of 355 nm). Note that, a wavelength of the laser beams La and Lb may beneficially be high in transmissivity with respect to the support substrate 8.

The stage 71a has the irradiation substrate 60a placed thereon, and may move in an X (vertical) direction and a Y (horizontal) direction in the processing room 70.

As illustrated in FIG. 4, the emitting head 72a emits the laser beam La perpendicularly to the surface of the irradiation substrate 60a.

As illustrated in FIG. 4, the emitting head 72b emits the laser beam Lb at an oblique angle (the incident angle θ: approximately from 30° to 80°) to the surface of the irradiation substrate 60a.

Note that this embodiment describes as an example the light irradiation device 80a including the movable stage 71a having the irradiation substrate 60a placed on the stage 71a. The movable stage 71a moves so that the light irradiation device 80a scans an area of the irradiation substrate 60a to be irradiated with the laser beams La and Lb to scan. Instead of moving the stage 71a, the emitting heads 72a and 72b may be moved.

Described here is delaminating an element using the light irradiation device 80a, with reference to FIGS. 4 to 17. Here, FIGS. 5, 6, 10 to 12, and 14 to 17 show the laser beams La and Lb emitted upward for the sake of convenience. However, as FIG. 4 shows, the laser beams La and Lb are emitted downward toward the irradiation substrate 60a on the stage 71a.

First, as illustrated in FIG. 4, the irradiation substrate 60a, prepared in the forming of an element, is placed on the stage 71a. Here, a surface of the irradiation substrate 60a to the organic EL display device 50a faces downward.

Next, as illustrated in FIGS. 4 and 5, the emitting head 72a emits the laser beam La perpendicularly to the surface of the support substrate 8 in the irradiation substrate 60a. Meanwhile, as illustrated in FIGS. 4 and 6, the emitting head 72b emits the laser beam Lb at an oblique angle to the surface of the support substrate 8 in the irradiation substrate 60a. Here, the stage 71a is sequentially moved in the X direction or the Y direction so that, as illustrated in FIGS. 7 to 12, the light irradiation device 80a scans areas to be irradiated with the laser beams La and Lb from an end toward another end of the support substrate 8. Here, in FIGS. 7 to 12, each area to be irradiated with the laser beams La and Lb is illustrated not to overlap with a previous area and a subsequent area to be irradiated. However, the laser beams La and Lb scan slightly narrower than the width of the area to be irradiated, so that the area to be irradiated slightly overlaps with the previous area to be irradiated. Note that, in this embodiment, a beam shape on a spot irradiated with the laser beams La and Lb is rectangular; however, the beam shape may be another shape such as circular and oval.

Figure 16:
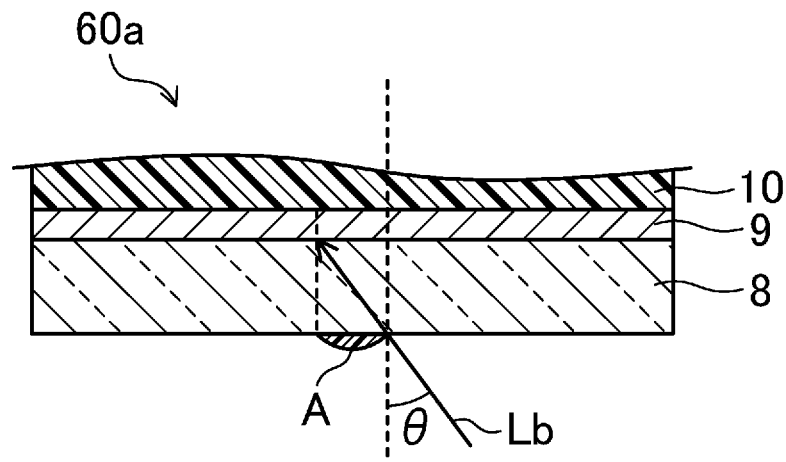
FIG. 16 is a first cross-sectional view illustrating an incident angle of the laser beam in the method for producing the organic EL display device according to the first embodiment of the present invention.
Figure 17:
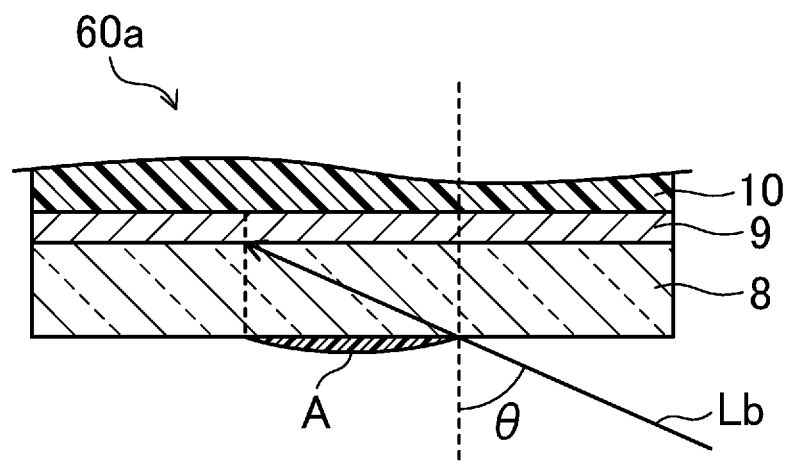
FIG. 17 is a second cross-sectional view illustrating an incident angle of the laser beam in the method for producing the organic EL display device according to the first embodiment of the present invention.

Hence, the separation layer 9 above the support substrate 8 expands and contracts in a short period of time (in a pulse width of a laser), such that adhesion at an interface between the separation layer 9 and the resin substrate layer 10 decreases. Thus, as illustrated in FIG. 13, the organic EL display device 50a including the resin substrate layer 10 and the organic EL element 19a is delaminated from the irradiation substrate 60a. Here, naturally, the laser beam Lb at an oblique angle to the surface of the support substrate 8 is lower in intensity than the laser beam La perpendicular to the surface of the support substrate 8. Moreover, since the laser beam La is emitted perpendicularly and then the laser beam Lb is emitted at an oblique angle, the laser beam Lb may be emitted with low intensity to a portion of the interface, between the separation layer 9 and the resin substrate layer 10, the adhesion of which is not reduced. Thus, the intensity of the laser beam Lb at an oblique angle may be set lower than when the laser beam Lb is emitted at an oblique angle and then the laser beam La is emitted perpendicularly. Moreover, as illustrated in FIG. 14, even though an extraneous matter A is found on the surface of the support substrate 8 and a non-irradiated area U with the laser beam La is found in the separation layer 9, the non-irradiated area U is irradiated with the laser beam Lb as illustrated in FIG. 15. Moreover, as illustrated in FIGS. 16 and 17, the laser beam Lb arrives in greater amount at a non-irradiated area caused by the extraneous matter A, as the incident angle θ to the surface of the support substrate 8 is greater.

In this manner, the organic EL display device 50a of this embodiment may be produced.

As described above, the production method of the organic EL display device 50a of this embodiment and the laser beam emitting apparatus 80a to be used in the method may provide effects (1) to (7) below.

(1) In the delaminating an element using the laser beam emitting apparatus 80a, the emitting head 72a emits the laser beam La perpendicularly to the surface of the support substrate 8 in the irradiation substrate 60a. Meanwhile the emitting head 72b emits the laser beam Lb at an oblique angle to the surface of the support substrate 8 in the irradiation substrate 60a. Thus, even though the extraneous matter A is found on the surface of the support substrate 8 and the non-irradiated area U with the laser beam La is found on the separation layer 9, the non-irradiated area U may be irradiated with the laser beam Lb. Such features make it possible to sufficiently supply the separation layer 9 with the energy of the laser beams La and Lb, contributing to reducing faulty delamination of the organic EL display device 50a.

(2) In the delaminating an element using the laser beam emitting apparatus 80a, the laser beam La is emitted perpendicularly to the surface of the support substrate 8 in the irradiation substrate 60a. Meanwhile, the laser beam Lb is emitted at an oblique angle to another area, on the surface of the support substrate 8, in the irradiation substrate 60a. Such a feature makes it possible to reduce a processing time required for the delaminating an element. Note that this embodiment describes as an example a production method which involves simultaneously emitting the laser beam La and the laser beam Lb to a different area; however, the laser beams La and Lb may be simultaneously emitted to the same area. Moreover, the laser beam La and the laser beam Lb may be alternately emitted to the same area, contributing to curbing an increase in the temperature of the irradiation substrate 60a and thus reducing damage to the organic EL element 19a.

(3) In the delaminating an element using the laser beam emitting apparatus 80a, the laser beam Lb at an oblique angle to the surface of the support substrate 8 in the irradiation substrate 60a is lower in intensity than the laser beam La perpendicular to the surface of the support substrate 8. Such a feature may reduce power to be consumed by the emission of the laser beams La and Lb, contributing to reducing a manufacturing cost.

(4) In the forming an element, the separation layer 9 is formed between the support substrate 8 and the resin substrate layer 10 to function as a thermo-photo exchanging film. Such a feature keeps the resin substrate layer 10 from being directly irradiated with the laser beams La and Lb, contributing to reducing damage by the laser beams La and Lb to the resin substrate layer 10. Note that, this embodiment describes as an example the organic EL display device 50a in which the separation layer 9 is provided between the support substrate 8 and the resin substrate layer 10; however, the separation layer 9 may be omitted so that ablation is caused in the resin substrate layer 10 close to the support substrate 8.

(5) In the forming an element, the base coat layer 11 is formed between the resin base coat layer 10 and the organic EL element 19a to function as a protective film. Such a feature reduces damage, to the resin substrate layer 10, caused by such processing as dry etching, wet etching, delamination of a resist, and baking. Note that this embodiment describes as an example the organic EL display device 50a in which the base coat layer 11 is provided between the resin substrate layer 10 and the organic EL element 19a; however, the base coat layer 11 may be omitted.

(6) In the forming an element, the organic EL element 19a is formed, and then the support 22 is attached to the surface of the organic EL element 19a. Such a feature makes it possible to reduce the risk of the organic EL display device 50a curling after the delaminating an element, facilitating processing in a subsequent step. Note that this embodiment describes as an example a method for producing the organic EL display device 50a in which the support 22 is attached to the surface of the organic EL element 19a; however, attaching the support 22 may be omitted.

(7) In the forming an element, the organic EL element 19a is formed, which implements a self-luminous display device.

Second Embodiment

Figure 18:
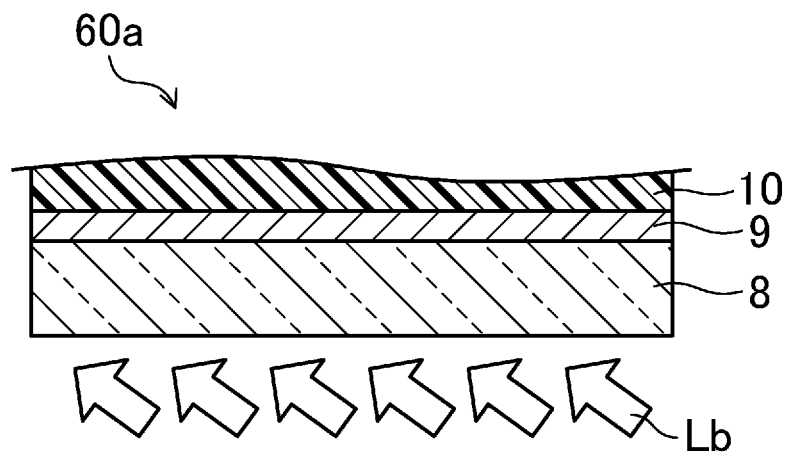
FIG. 18 is a first cross-sectional view illustrating a method for producing an organic EL display device according to a second embodiment of the present invention.
Figure 19:
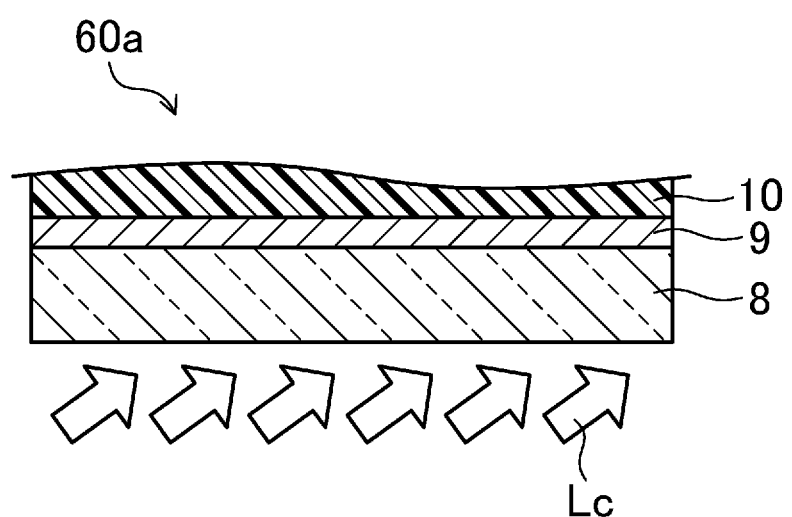
FIG. 19 is a second cross-sectional view illustrating the method for producing the organic EL display device according to the second embodiment of the present invention.
Figure 20:
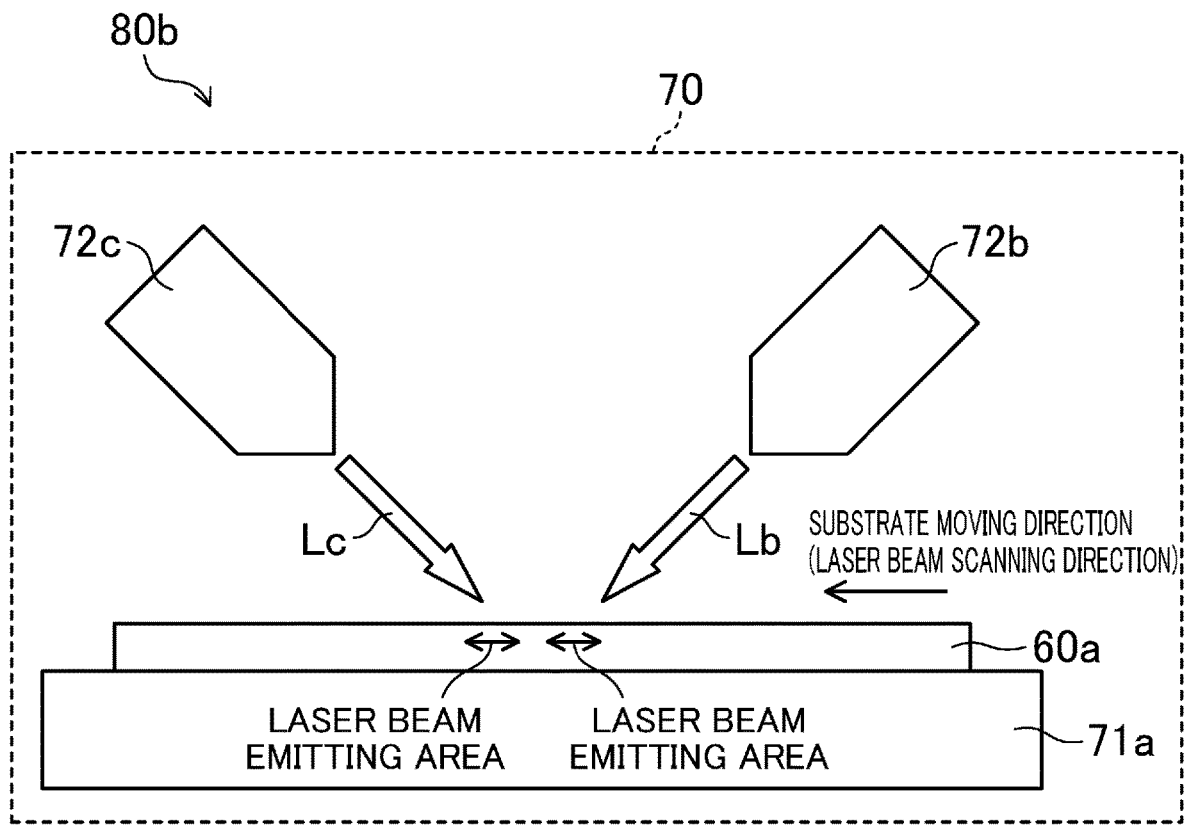
FIG. 20 is a lateral view illustrating a light irradiation device to be used for the method for producing the organic EL display device according to the second embodiment of the present invention.
Figure 21:
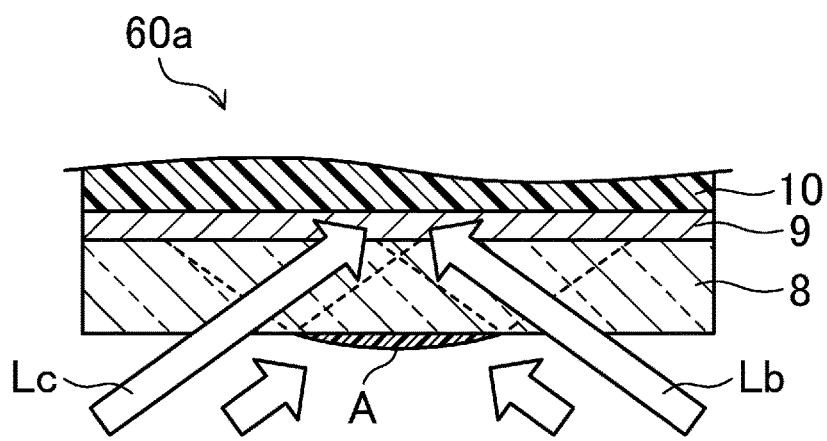
FIG. 21 is a cross-sectional view illustrating an effect of the method for producing the organic EL display device according to the second embodiment of the present invention.

FIGS. 18 to 21 illustrate a second embodiment of a method for producing a thin-film element device according to the present invention, and a light irradiation device to be used in the method. Note that, in this embodiment, a method for producing an organic EL display device is described as an example of the method for producing a thin-film element device, and a laser beam emitting apparatus is described as an example of the light irradiation device to be used for the method. Here, FIGS. 18 and 19 are the first and second cross-sectional views illustrating the method for producing the organic EL display device 50a of this embodiment. FIG. 20 is a lateral view illustrating a light irradiation device 80b to be used for the method for producing the organic EL display 50a of this embodiment. FIG. 21 is a cross-sectional view illustrating an effect of the method for producing the organic EL display device 50a of this embodiment. In the embodiments below, components equivalent to those illustrated in FIGS. 1 to 17 are denoted by the same reference characters, and the detailed explanation thereof will be omitted.

The above first embodiment describes, as an example, a method for producing the organic EL display device 50a with the laser beam La perpendicularly emitted, and the laser beam Lb emitted at an oblique angle, to the surface of the support substrate 8 in the irradiation substrate 60a. Instead, this embodiment describes, as an example, a method for producing the organic EL display device 50a with the laser beam Lb emitted at a first angle, and a laser beam Lc emitted at a second angle, to the surface of the support substrate 8 of the irradiation substrate 60a.

Note that the method for producing the organic EL display device 50a of this embodiment includes forming an element and delaminating the element. The forming an element is substantially the same as that in the first embodiment, and described below is the delaminating the element.

<Delaminating Element>

Described here is the light irradiation device 80b to be used for the delaminating the element.

As illustrated in FIG. 20, the light irradiation device 80b includes: the processing room 70 having a substantially sealed space therein; the stage 71a, the emitting head 72b, and an emitting head 72c provided in the processing room 70; and a laser source (not shown) supplying the emitting head 72b with the laser beam Lb and the emitting head 72c with a laser beam Lc via an optical fiber cable.

As illustrated in FIG. 20, the emitting head 72b emits the laser beam Lb at the first angle (from the top right toward the bottom left in the drawing) to the surface of the irradiation substrate 60a.

As illustrated in FIG. 20, the emitting head 72c emits the laser beam Lb at the second angle (from the top left toward the bottom right in the drawing) to the surface of the irradiation substrate 60a.

Note that, as seen in the above first embodiment, this embodiment describes as an example the light irradiation device 80b including the movable stage 71a having the irradiation substrate 60a placed on the stage 71a to allow the laser beams Lb and Lc to scan an area, of the irradiation substrate 60a, to be irradiated. Instead of moving the stage 71a, the emitting heads 72b and 72c may be moved.

Described here is delaminating an element using the light irradiation device 80b, with reference to FIGS. 18 to 21. Here, FIGS. 18, 19, and 21 show the laser beams Lb and Lc emitted upward for the sake of convenience. However, as FIG. 20 shows, the laser beams Lb and Lc are emitted downward toward the irradiation substrate 60a on the stage 71a.

First, as illustrated in FIG. 20, the irradiation substrate 60a, prepared in the forming of an element in the above first embodiment, is placed on the stage 71a. Here, a surface of the irradiation substrate 60a to the organic EL display device 50a faces downward.

Next, as illustrated in FIGS. 18 and 20, the emitting head 72b emits the laser beam Lb at the first angle to the surface of the support substrate 8 in the irradiation substrate 60a. Meanwhile, as illustrated in FIGS. 19 and 20, the emitting head 72c emits the laser beam Lc at the second angle to the surface of the support substrate 8 in the irradiation substrate 60a. Here, the stage 71a is sequentially moved in the X direction or the Y direction so that the laser beams Lb and Lc scan the area to be irradiated from an end toward another end of the support substrate 8. Here, in the scanning, the laser beams Lb and Lc scan slightly narrower than the width of the area to be irradiated, so that the area to be irradiated slightly overlaps with the previous area to be irradiated.

Hence, the separation layer 9 above the support substrate 8 expands and contracts in a short period of time (in a pulse width of a laser), such that adhesion at an interface between the separation layer 9 and the resin substrate layer 10 decreases. Thus the organic EL display device 50a including the resin substrate layer 10 and the organic EL element 19a is delaminated from the irradiation substrate 60a. (See FIG. 13, for example.) Here, as illustrated in FIG. 21, even though an extraneous matter A is found on the surface of the support substrate 8 and a non-irradiated area with the laser beam Lb is found in the separation layer 9, the non-irradiated area is irradiated with the laser beam Lc.

In this manner, the organic EL display device 50a of this embodiment may be produced.

As described above, the production method of the organic EL display device 50a of this embodiment and the laser beam emitting apparatus 80b to be used in the method may provide an effect (8) below, other than the above-described effects (1), (2), and (4) to (7).

Specifically describing on the effect (1), in the delaminating an element using the laser beam emitting apparatus 80b, the emitting head 72b emits the laser beam Lb at the first angle to the surface of the support substrate 8 in the irradiation substrate 60a. Meanwhile the emitting head 72c emits the laser beam Lc at the second angle to the surface of the support substrate 8 in the irradiation substrate 60a. Thus, even though the extraneous matter A is found on the surface of the support substrate 8 and the non-irradiated area with the laser beam Lb is found on the separation layer 9, the non-irradiated area may be irradiated with the laser beam Lc. Such features make it possible to sufficiently supply the separation layer 9 with the energy of the laser beams Lb and Lc, contributing to reducing faulty delamination of the organic EL display device 50a.

Specifically describing on the effect (2), in the delaminating an element using the laser beam emitting apparatus 80b, the surface of the support substrate 8 in the irradiation substrate 60a is simultaneously irradiated with the laser beam Lb at the first angle and the laser beam Lc at the second angle. Such a feature makes it possible to reduce a processing time required for the delaminating an element. Note that this embodiment describes as an example a production method which involves simultaneously emitting the laser beam Lb and the laser beam Lc to a different area; however, the laser beams Lb and Lc may be simultaneously emitted to the same area. Moreover, the laser beam Lb and the laser beam Lc may be alternately emitted to the same area, contributing to curbing an increase in the temperature of the irradiation substrate 60a and thus reducing damage to the organic EL element 19a.

(8) In the delaminating an element using the laser beam emitting apparatus 80b, the surface of the support substrate 8 in the irradiation substrate 60a is irradiated with the laser beam Lb emitted at the first angle and the laser beam Lc emitted at the second angle. Hence, even though the extraneous matter A having a large area is found on the surface of the support substrate 8, such a feature may make a non-irradiated area with a laser beam harder to form, compared with the case where the laser beam emitting apparatus 80a of the first embodiment is used.

Third Embodiment

Figure 22:
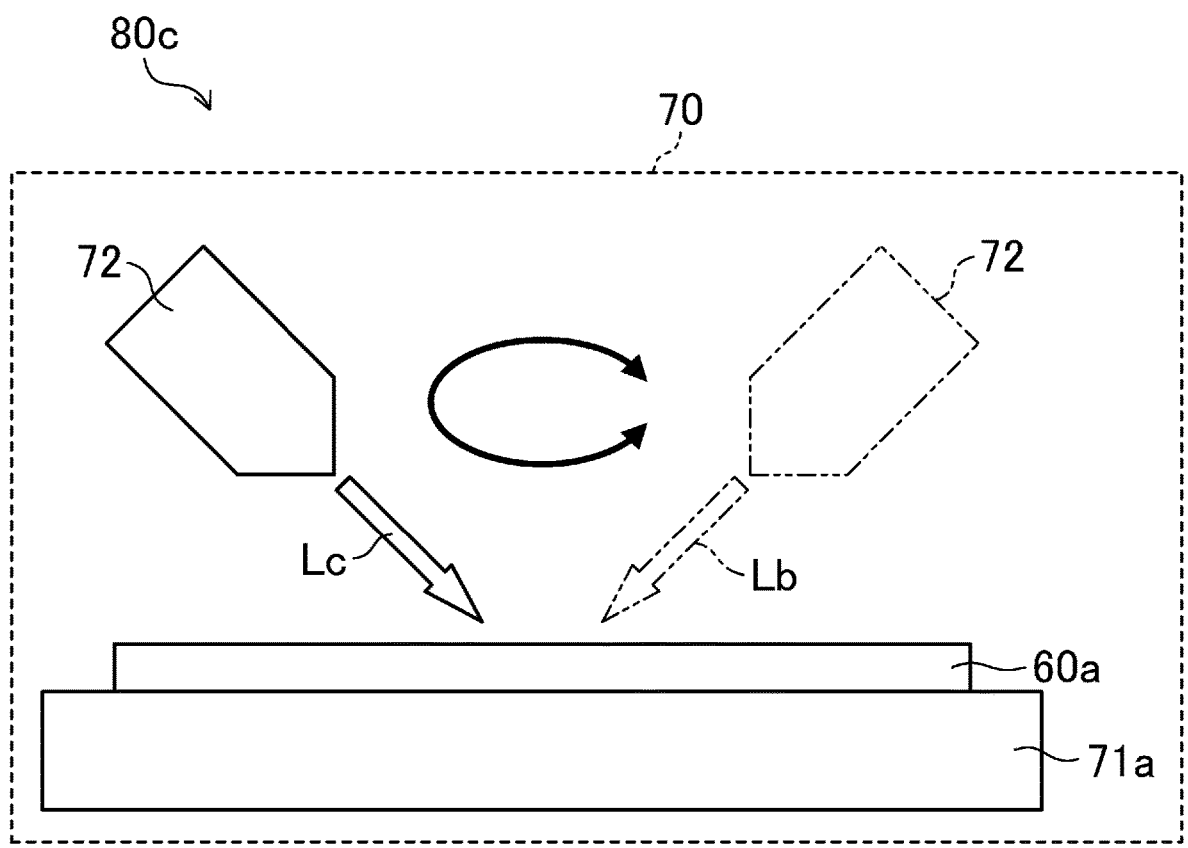
FIG. 22 is a lateral view illustrating a light irradiation device to be used in a method for producing an organic EL display device according to a third embodiment of the present invention.
Figure 23:
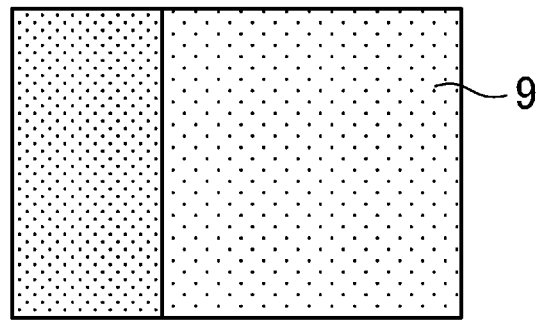
FIG. 23 is a plan view illustrating a method for emitting the laser beam in the method for producing the organic EL display device according to the third embodiment of the present invention.
Figure 24:
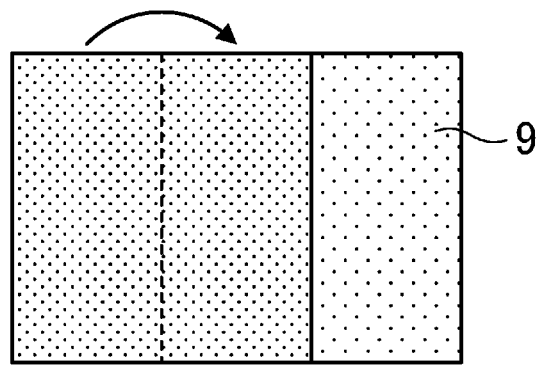
FIG. 24 is a plan view illustrating a method for emitting the laser beam in the method for producing the organic EL display device according to the third embodiment of the present invention.
Figure 25:
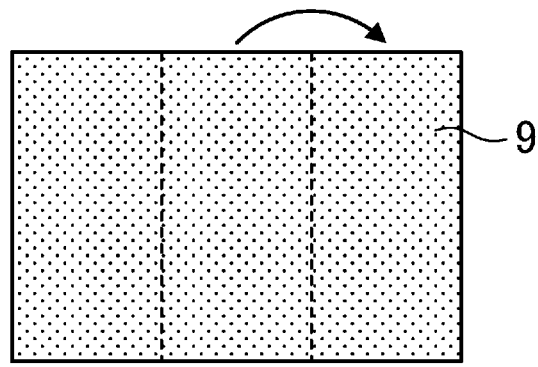
FIG. 25 is a plan view illustrating a method for emitting the laser beam in the method for producing the organic EL display device according to the third embodiment of the present invention.
Figure 26:
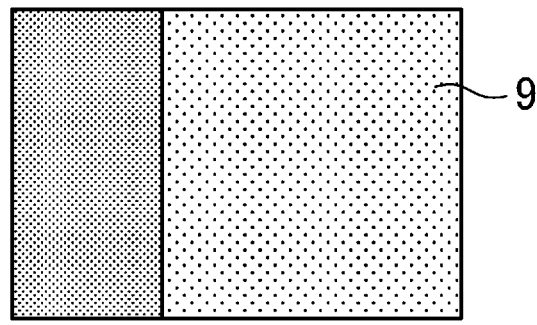
FIG. 26 is a plan view illustrating the method for emitting the laser beam in the method for producing the organic EL display device according to the third embodiment of the present invention.
Figure 27:
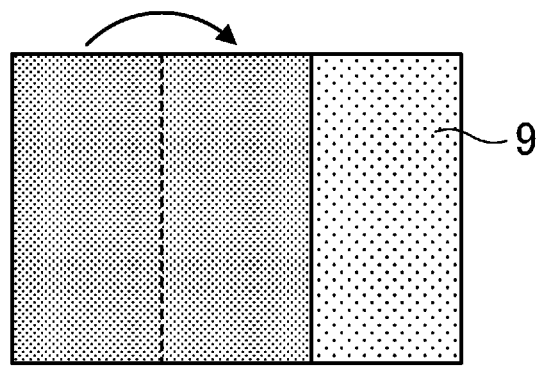
FIG. 27 is a plan view illustrating a method for emitting the laser beam in the method for producing the organic EL display device according to the third embodiment of the present invention.
Figure 28:
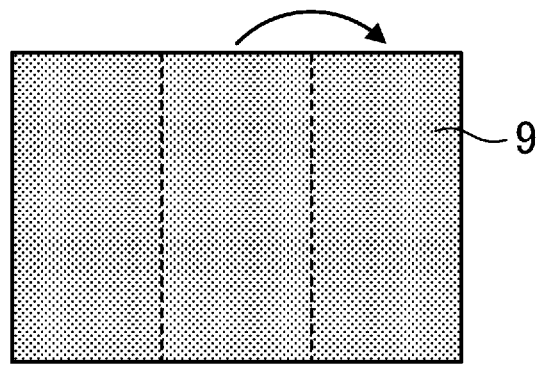
FIG. 28 is a plan view illustrating the method for emitting the laser beam in the method for producing the organic EL display device according to the third embodiment of the present invention.
Figure 29:
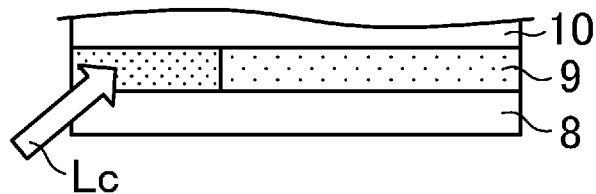
FIG. 29 is a cross-sectional view illustrating the method for emitting the laser beam in the method for producing the organic EL display device according to the third embodiment of the present invention.
Figure 30:
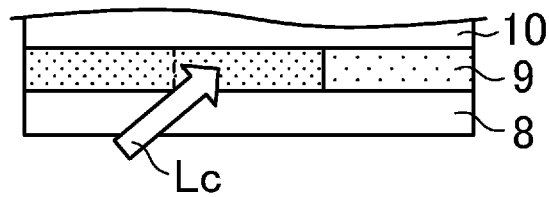
FIG. 30 is a cross-sectional view illustrating the method for emitting the laser beam in the method for producing the organic EL display device according to the third embodiment of the present invention.
Figure 31:
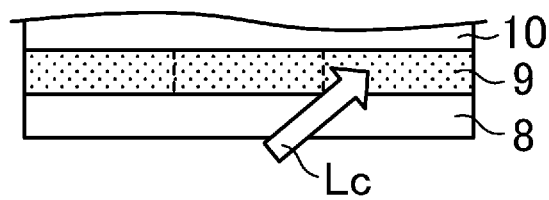
FIG. 31 is a cross-sectional view illustrating the method for emitting the laser beam in the method for producing the organic EL display device according to the third embodiment of the present invention.
Figure 32:
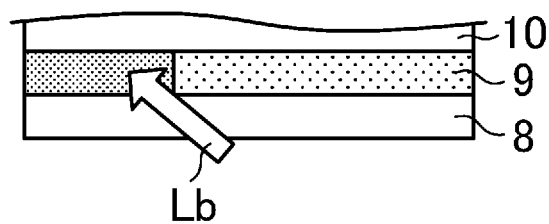
FIG. 32 is a cross-sectional view illustrating the method for emitting the laser beam in the method for producing the organic EL display device according to the third embodiment of the present invention.
Figure 33:
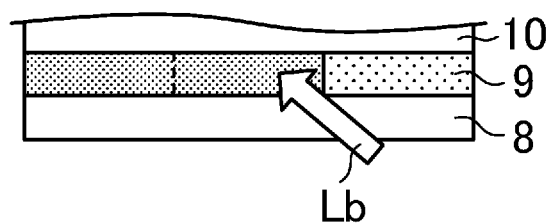
FIG. 33 is a cross-sectional view illustrating the method for emitting the laser beam in the method for producing the organic EL display device according to the third embodiment of the present invention.
Figure 34:
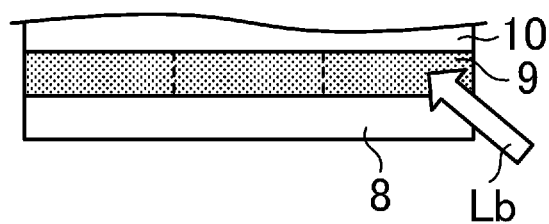
FIG. 34 is a cross-sectional view illustrating the method for emitting the laser beam in the method for producing the organic EL display device according to the third embodiment of the present invention.
Figure 35:
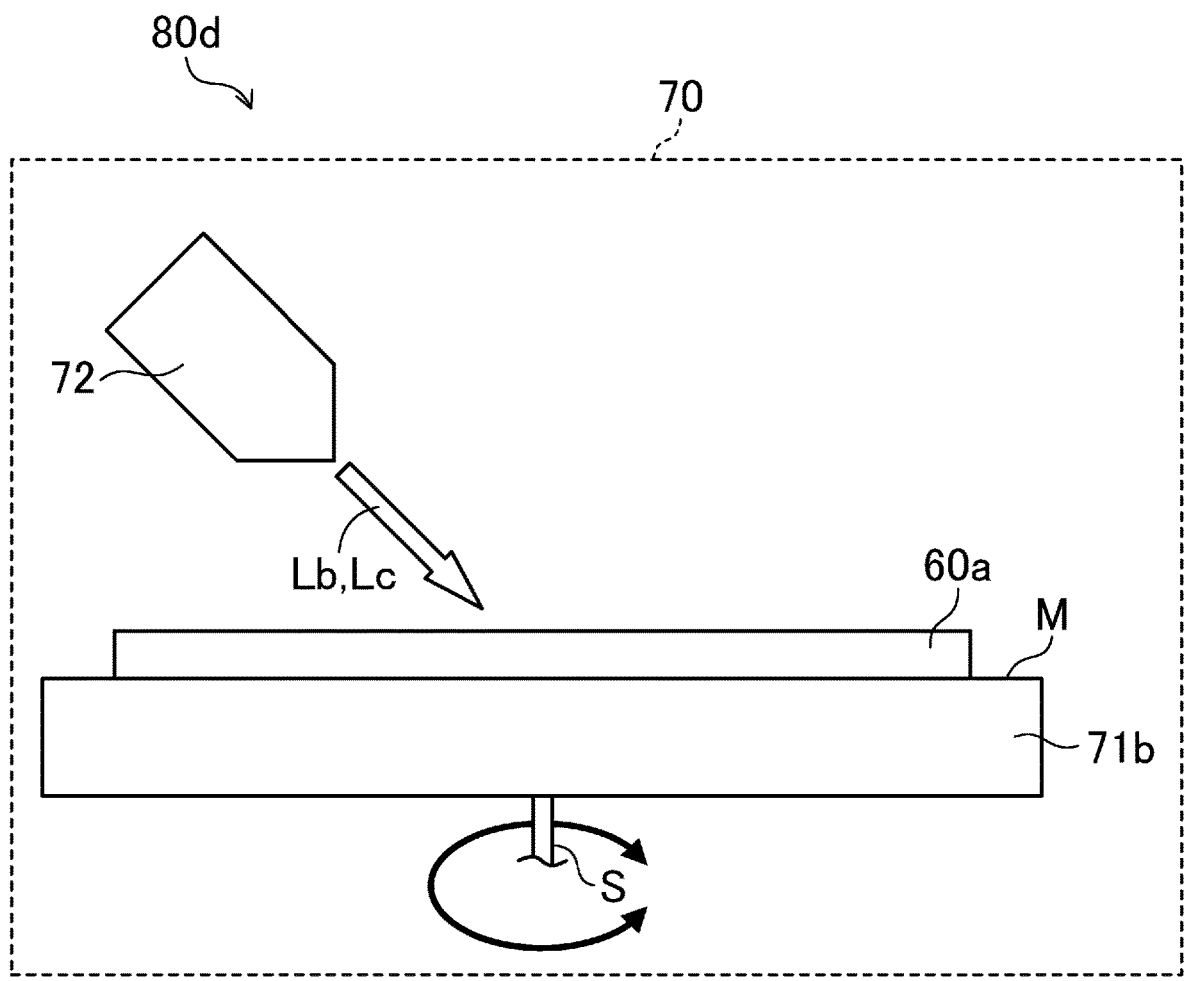
FIG. 35 is a lateral view illustrating a light irradiation device, in a first modification, to be used for a method for producing the organic EL display device according to the third embodiment of the present invention.
Figure 36:
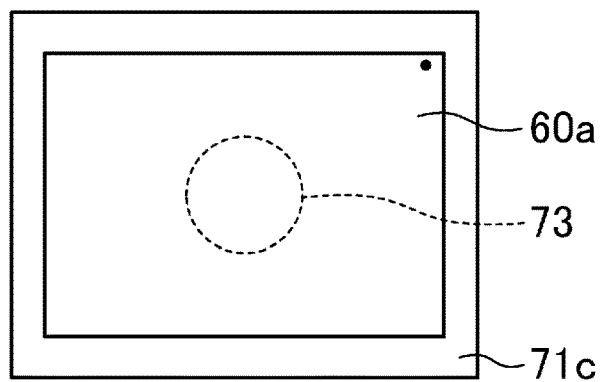
FIG. 36 is a plan view illustrating a modification of a substrate rotation mechanism in the light irradiation device, of the first modification, to be used for the method for producing the organic EL display device according to the third embodiment of the present invention.
Figure 37:
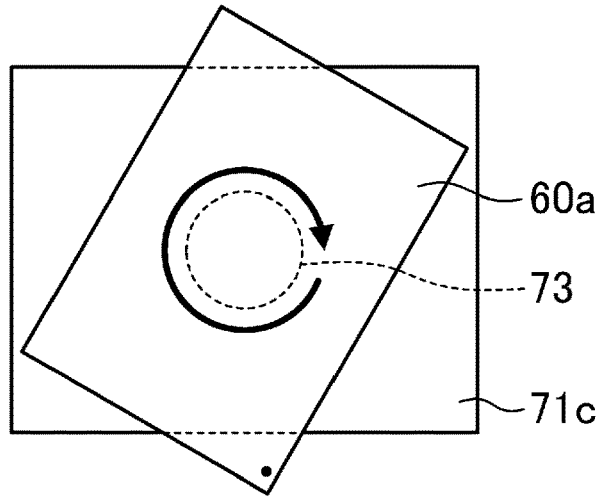
FIG. 37 is a plan view illustrating the modification of the substrate rotation mechanism in the light irradiation device, of the first modification, to be used for the method for producing the organic EL display device according to the third embodiment of the present invention.
Figure 38:
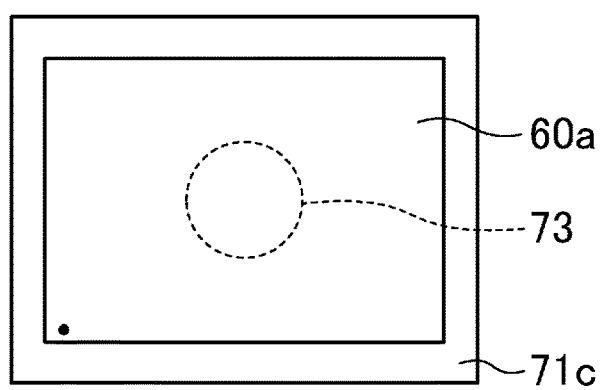
FIG. 38 is a plan view illustrating the modification of the substrate rotation mechanism in the light irradiation device, of the first modification, to be used for the method for producing the organic EL display device according to the third embodiment of the present invention.
Figure 39:
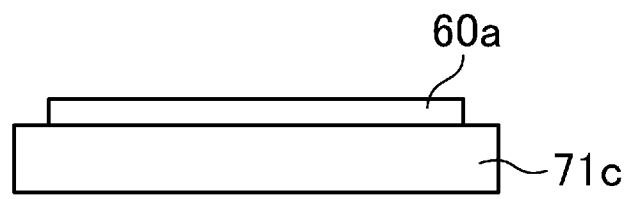
FIG. 39 is a lateral view illustrating the modification of the substrate rotation mechanism in the light irradiation device, of the first modification, to be used for the method for producing the organic EL display device according to the third embodiment of the present invention.
Figure 40:
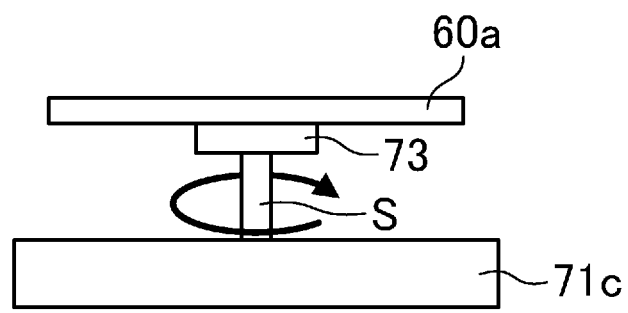
FIG. 40 is a lateral view illustrating the modification of the substrate rotation mechanism in the light irradiation device, of the first modification, to be used for the method for producing the organic EL display device according to the third embodiment of the present invention.
Figure 41:
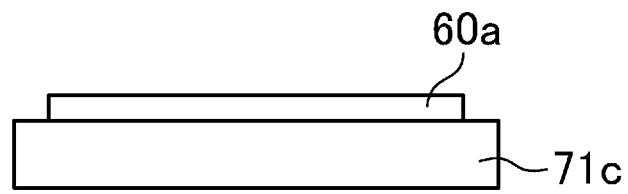
FIG. 41 is a lateral view illustrating the modification of the substrate rotation mechanism in the light irradiation device, of the first modification, to be used for the method for producing the organic EL display device according to the third embodiment of the present invention.
Figure 42:
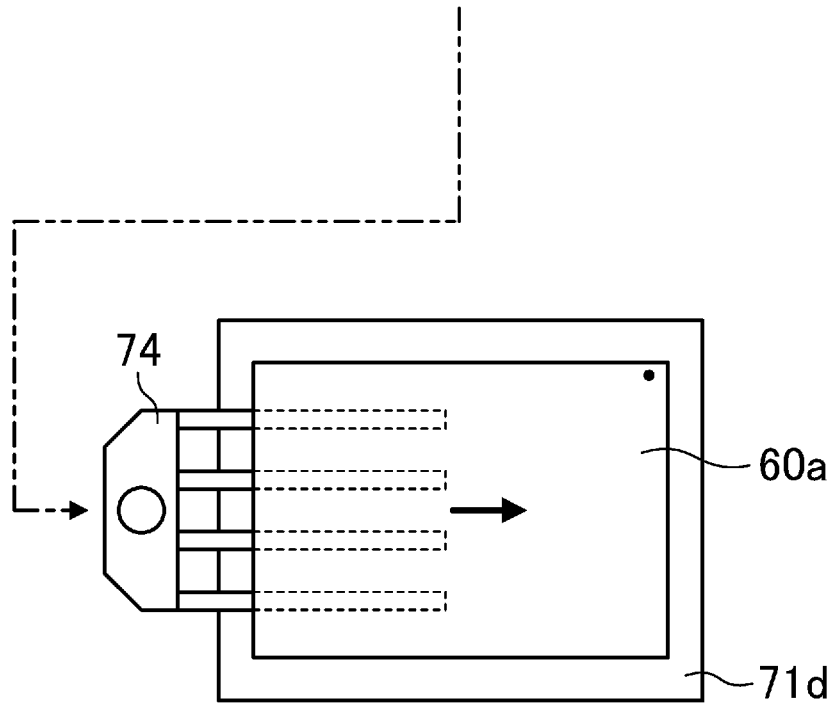
FIG. 42 is a plan view illustrating another modification of the substrate rotation mechanism in the light irradiation device, of the first modification, to be used for the method for producing the organic EL display device according to the third embodiment of the present invention.
Figure 43:
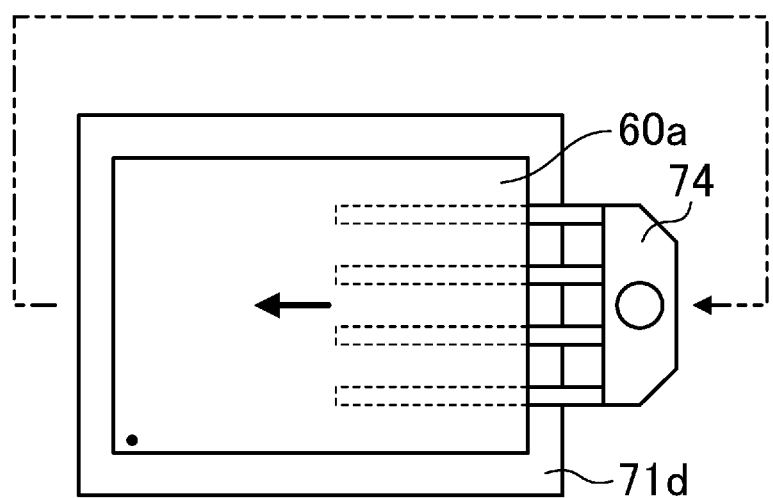
FIG. 43 is a plan view illustrating another modification of the substrate rotation mechanism in the light irradiation device, of the first modification, to be used for the method for producing the organic EL display device according to the third embodiment of the present invention.
Figure 44:
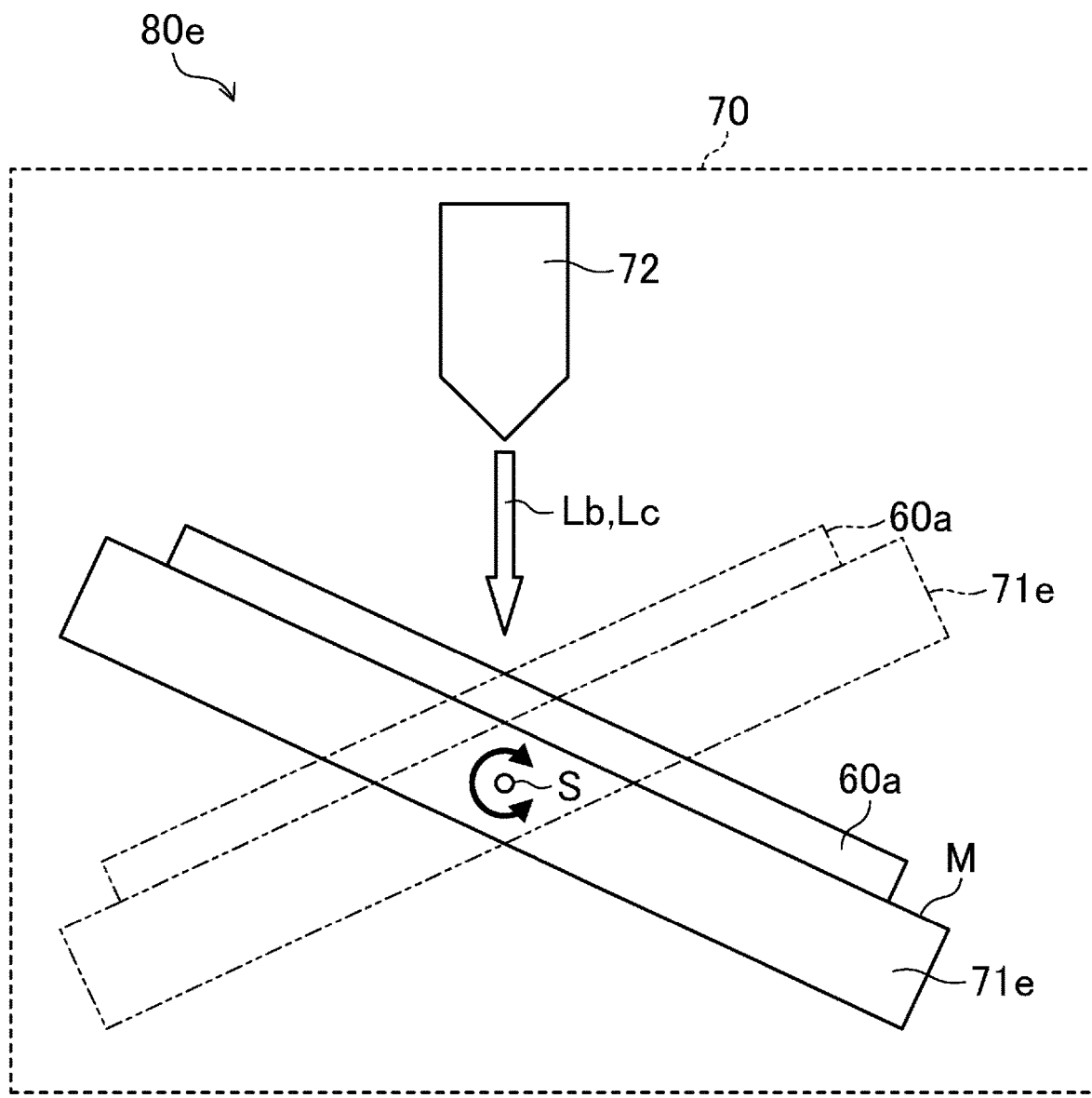
FIG. 44 is a lateral view illustrating a light irradiation device, in a second modification, to be used for a method for producing the organic EL display device according to the third embodiment of the present invention.

FIGS. 22 to 44 illustrate a third embodiment of a method for producing a thin-film element device according to the present invention, and a light irradiation device to be used in the method. Note that, in this embodiment, a method for producing an organic EL display device is described as an example of the method for producing a thin-film element device, and a laser beam emitting apparatus is described as an example of the light irradiation device to be used for the method. FIG. 22 is a lateral view illustrating a light irradiation device 80c to be used for the method for producing the organic EL display 50a of this embodiment. FIGS. 23 to 34 are plan views and cross-sectional views illustrating a method for emitting the laser beams Lb and Lc in the method for producing the organic EL display device 50a. FIG. 35 is a lateral view illustrating a light irradiation device 80d, of a first modification, to be used for the method for producing the organic EL display 50a of this embodiment. FIGS. 36 to 41 are plan views and lateral views illustrating a modification of a substrate rotation mechanism in the light irradiation device 80d. FIG. 42 is a plan view illustrating another modification of the substrate rotation mechanism in the light irradiation device 80d. FIG. 44 is a lateral view illustrating a light irradiation device 80e, of a second modification, to be used for the method for producing the organic EL display 50a of this embodiment.

The first and second embodiments describe a method for producing the organic EL display device 50a, using the laser beam emitting apparatuses 80a and 80b each including two emitting heads. Instead, this embodiment describes as an example a method for producing the organic EL display device 50a, using the laser beam emitting apparatus 80c including one emitting head 72.

Note that the method for producing the organic EL display device 50a of this embodiment includes forming an element and delaminating the element. The forming an element is substantially the same as that in the first embodiment, and described below is the delaminating the element.

<Delaminating Element>

Described here is the light irradiation device 80c to be used for the delaminating the element.

As illustrated in FIG. 22, the light irradiation device 80c includes: the processing room 70 having a substantially sealed space therein; the stage 71a and the emitting head 72 provided in the processing room 70; and a laser source (not shown) supplying the emitting head 72 with the laser beams Lb and Lc via an optical fiber cable.

As illustrated in FIG. 22, the emitting head 72 is reversibly provided at 180° so as to switch between (i) a state in which the laser beam Lc is emitted to the surface of the irradiation substrate 60a at the first angle from the top left toward the bottom right in the drawing and (ii) a state (chain double-dashed line) in which the laser beam Lb is emitted to the surface of the irradiation substrate 60a at the second angle from the top right toward the bottom left in the drawing.

Note that, as seen in the above first embodiment, this embodiment describes as an example the light irradiation device 80c including the movable stage 71a having the irradiation substrate 60a placed on the stage 71a to allow the laser beams Lb and Lc to scan an area, of the irradiation substrate 60a, to be irradiated. Instead of moving the stage 71a, the emitting head 72 may be moved.

Described here is delaminating an element using the light irradiation device 80c, with reference to FIGS. 22 to 34. Here, FIGS. 29 to 34 show the laser beams Lb and Lc emitted upward for the sake of convenience. However, as FIG. 22 shows, the laser beams Lb and Lc are emitted downward toward the irradiation substrate 60a on the stage 71a.

First, as illustrated in FIG. 22, the irradiation substrate 60a, prepared in the forming of an element in the above first embodiment, is placed on the stage 71a. Here, a surface of the irradiation substrate 60a to the organic EL display device 50a faces downward.

Next, as illustrated in FIG. 22, the emitting head 72 emits the laser beam Lc at the first angle to the surface of the support substrate 8 in the irradiation substrate 60a, and then reverses at 180° (chain double-dashed line) to emit the laser beam Lb at the second angle to the surface of the support substrate 8 in the irradiation substrate 60a. Here, the stage 71a is sequentially moved in the X direction or the Y direction so that, as illustrated in FIGS. 23 to 35 and FIGS. 29 to 31, the laser beam Lc scans the area to be irradiated from an end toward another end of the support substrate 8. Moreover, after moving back to the original position, the stage 71a is sequentially moved in the X direction or the Y direction so that, as illustrated in FIGS. 26 to 28 and FIGS. 32 to 34, the laser beam Lb scans each of areas to be irradiated from an end toward another end of the support substrate 8. Here, in FIGS. 23 to 34, each area to be irradiated with the laser beams Lb and Lc is illustrated not to overlap with a previous area and a subsequent area to be irradiated. However, the laser beams Lb and Lc scan slightly narrower than the width of the area to be irradiated, so that the area to be irradiated slightly overlaps with the previous area to be irradiated.

Hence, the separation layer 9 above the support substrate 8 expands and contracts in a short period of time (in a pulse width of a laser), such that adhesion at an interface between the separation layer 9 and the resin substrate layer 10 decreases. Thus the organic EL display device 50a including the resin substrate layer 10 and the organic EL element 19a is delaminated from the irradiation substrate 60a. (See FIG. 13, for example.)

In this manner, the organic EL display device 50a of this embodiment may be produced.

Note that this embodiment describes as an example the light irradiation device 80c in which the emitting head 72 reverses to switch the directions of the laser beams Lb and Lc to be emitted. However, the light irradiation device 80c may be configured as light irradiation devices 80d and 80e below.

As illustrated in FIG. 35, the light irradiation device 80d includes: the processing room 70 having a substantially sealed space therein; the stage 71a and the emitting head 72 provided in the processing room 70; and a laser source (not shown) supplying the emitting head 72 with the laser beams Lb and Lc via an optical fiber cable. Here, as illustrated in FIG. 35, in accordance with a movement of the stage 71b, the emitting head 72 emits the laser beam Lc at the first angle and the laser beam Lb at the second angle to the surface of the irradiation substrate 60a. Then, as illustrated in FIG. 35, the stage 71b is provided to a rotating shaft S to rotate at 180° around the rotating shaft S, so as to switch a direction of the laser beams Lb and Lc to be emitted to the irradiation substrate 60a. Here, the rotating shaft S is perpendicular to a face M, of the stage 71b, on which the irradiation substrate 60a is placed. Note that, the light irradiation device 80d includes a substrate rotation mechanism allowing the stage 71b to rotate at 180° around the rotating shaft S. Instead, the substrate rotation mechanism may be configured as illustrated, for example, in FIGS. 36 to 41 and FIG. 42. Here, in the plan views in FIGS. 36 to 38 and FIG. 42, one of the corners of the irradiation substrate 60a has a black dot to clearly show a direction of the irradiation substrate 60a.

Specifically, a stage 71c as a substitute for the stage 71b includes a substrate rotation and elevation mechanism 73 as illustrated in FIGS. 36 to FIG. 41. Here, as illustrated in FIG. 36 to FIG. 41, the substrate rotation and elevation mechanism 73 sticks to and lifts the irradiation substrate 60a from a surface of the stage 71c, turns the irradiation substrate 60a around at 180° around the rotating shaft S, and then puts the irradiation substrate 60a down to the surface of the stage 71c. Moreover, as illustrated in FIG. 42, a stage 71d as a substitute for the stage 71b does not include the substrate rotation mechanism as described above. Instead, the stage 71d may include a transporting robot 74 moving along with a chain double-dashed line in the drawing to transport the irradiation substrate 60a on the stage 71d, and change a direction of the irradiation substrate 60a.

As illustrated in FIG. 44, a light irradiation device 80e includes: the processing room 70 having a substantially sealed space therein; the stage 71e and the emitting head 72 provided in the processing room 70; and a laser source (not shown) supplying the emitting head 72 with the laser beams Lb and Lc via an optical fiber cable. Here, as illustrated in FIG. 44, in accordance with a movement of the stage 71e, the emitting head 72 emits the laser beam Lc at the first angle and the laser beam Lb at the second angle to the surface of the irradiation substrate 60a. Then, as illustrated in FIG. 44, the stage 71e is provided to, and rotates around, the rotating shaft S so as to switch a direction of the laser beams Lb and Lc to be emitted to the irradiation substrate 60a. Here, rotating shaft S is in parallel with the face M, of the stage 71e, on which the irradiation substrate 60a is placed.

As described above, the production method of the organic EL display device 50a of this embodiment and the laser beam emitting apparatuses 80c to 80e to be used in the method may provide an effect (9) below, other than the above-described effects (1), and (4) to (8).

Specifically describing on the effect (1), in the delaminating an element using the laser beam emitting apparatuses 80c to 80e, the emitting head 72 emits the laser beam Lc at the first angle to the surface of the support substrate 8 in the irradiation substrate 60a, and then emits the laser beam Lb at the second angle to the surface of the support substrate 8 in the irradiation substrate 60a. Thus, even though the extraneous matter A is found on the surface of the support substrate 8 and the non-irradiated area with the laser beam Lc is found on the separation layer 9, the non-irradiated area may be irradiated with the laser beam Lb. Such features make it possible to sufficiently supply the separation layer 9 with the energy of the laser beams Lb and Lc, contributing to reducing faulty delamination of the organic EL display device 50a.

Specifically describing on (8), in the delaminating an element using the laser beam emitting apparatus 80c to 80e, the surface of the support substrate 8 in the irradiation substrate 60a is irradiated with the laser beam Lc emitted at the first angle and the laser beam Lb emitted at the second angle. Hence, even though the extraneous matter A having a large area is found on the surface of the support substrate 8, such a feature may make a non-irradiated area with a laser beam harder to form, compared with the case where the laser beam emitting apparatus 80a of the first embodiment is used.

(9) The laser beam emitting apparatus 80c to 80e include only one emitting head 72, which requires just one laser oscillator to supply a laser beam to the emitting head 72. Such a feature may implement the laser beam emitting apparatus 80c to 80e at a low cost.

Fourth Embodiment

Figure 45:
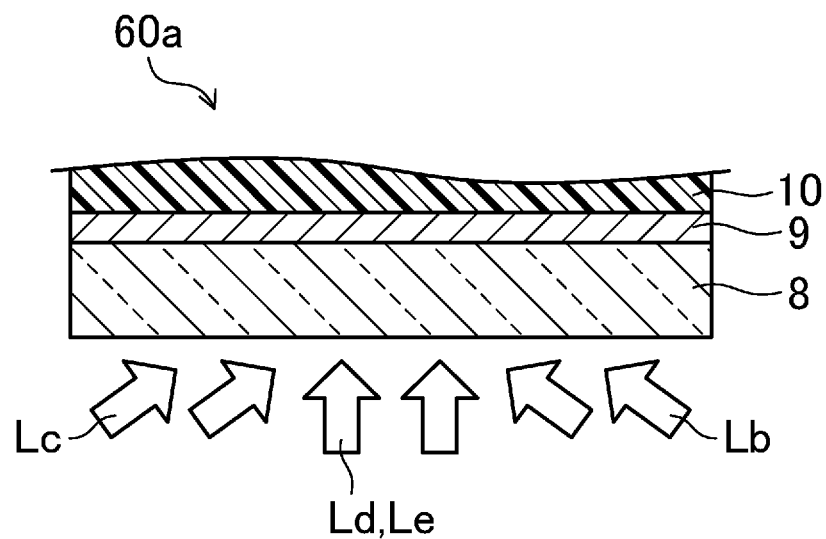
FIG. 45 is a cross-sectional view illustrating a method for manufacturing an organic EL display device according to a fourth embodiment of the present invention.
Figure 46:
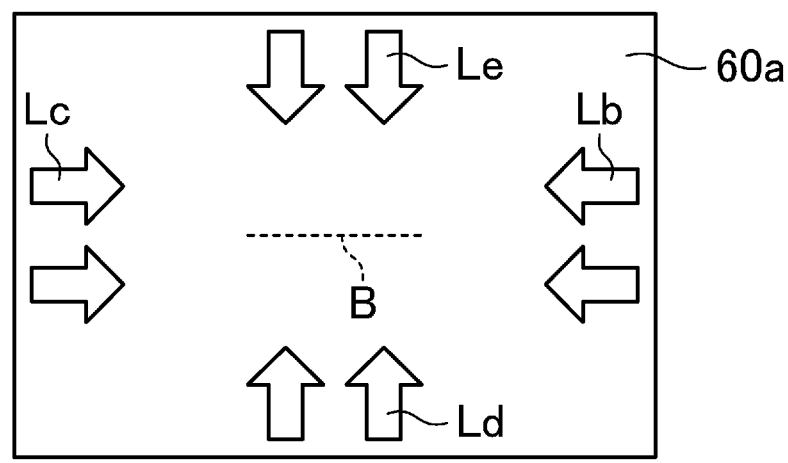
FIG. 46 is a plan view illustrating a method for manufacturing the organic EL display device according to the fourth embodiment of the present invention.
Figure 47:
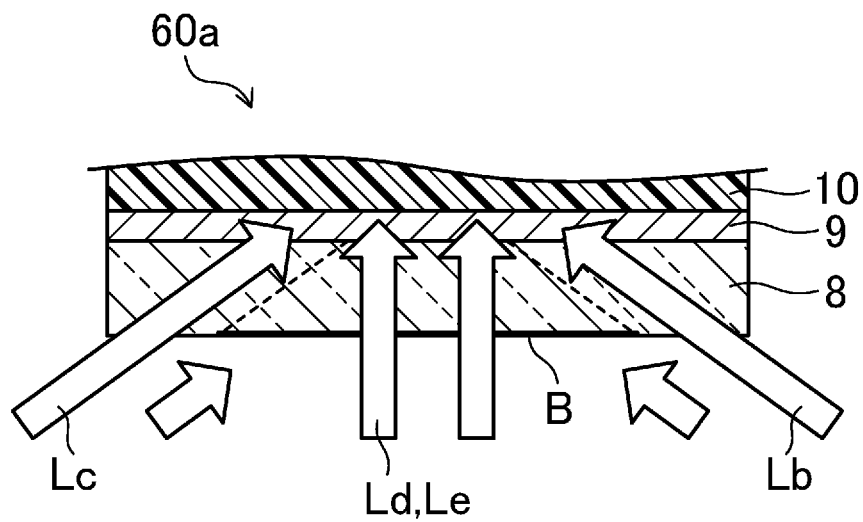
FIG. 47 is a cross-sectional view illustrating an effect of the method for producing the organic EL display device according to the fourth embodiment of the present invention.

FIGS. 45 to 47 illustrate a fourth embodiment of a method for producing a thin-film element device according to the present invention, and a light irradiation device to be used in the method. Note that, in this embodiment, a method for producing an organic EL display device is described as an example of the method for producing a thin-film element device, and a laser beam emitting apparatus is described as an example of the light irradiation device to be used for the method. Here, FIG. 45 and FIG. 46 are respectively a cross-sectional view and a plan view illustrating the method for producing the organic EL display device 50a of this embodiment. FIG. 47 is a cross-sectional view illustrating an effect of the method for producing the organic EL display device 50a of this embodiment.

The second and third embodiments describe as an example a method for producing the organic EL display device 50a, the method which involves emitting the laser beams Lb and Lc at two angles. Instead, this embodiment describes as an example a method for producing the organic EL display device 50a emitting the laser beams Lb to Le at an oblique angle of 90° apart from each other in the planar view.

Note that the method for producing the organic EL display device 50a of this embodiment includes forming an element and delaminating the element. The forming an element is substantially the same as that in the first embodiment, and described below is the delaminating the element.

<Delaminating Element>

Here, the delaminating the element may be carried out, using, for example, the light irradiation device 80d described in the third embodiment. Note that, in order to implement the method for producing the organic EL display device 50a of this embodiment, the stage 71b may be provided to the rotating shaft S, perpendicular to a placing face M to the irradiation substrate 60a, to rotate at 90° each around the rotating shaft S. Moreover, FIGS. 45 and 47 show the laser beams Lb to Le emitted upward for the sake of convenience. However, the laser beams Lb to Le are emitted downward toward the irradiation substrate 60a on the stage 71a. (See FIG. 35.)

First, as illustrated in FIG. 35, the irradiation substrate 60a, prepared in the forming of an element in the above first embodiment, is placed on the stage 71b. Here, a surface of the irradiation substrate 60a to the organic EL display device 50a faces downward.

Then, as illustrated in FIGS. 35, 45, and 46, the emitting head 72 emits the laser beam Lc at the first angle to the surface of the support substrate 8 in the irradiation substrate 60a. Here, the stage 71b is sequentially moved in the X direction or the Y direction so that the laser beam Lc scans the area to be irradiated from an end toward another end of the support substrate 8.

Then, the stage 71b is rotated clockwise at 90°, and the emitting head 72 emits the laser beam Ld at the second angle to the surface of the support substrate 8 in the irradiation substrate 60a. Here, the stage 71b is sequentially moved in the X direction or the Y direction so that the laser beam Ld scans the area to be irradiated from an end toward another end of the support substrate 8.

Moreover, the stage 71b is rotated clockwise at 90°, and the emitting head 72 emits the laser beam Lb at the third angle to the surface of the support substrate 8 in the irradiation substrate 60a. Here, the stage 71b is sequentially moved in the X direction or the Y direction so that the laser beam Lb scans the area to be irradiated from an end toward another end of the support substrate 8.

Finally, the stage 71b is rotated clockwise at 90°, and the emitting head 72 emits the laser beam Le at the fourth angle to the surface of the support substrate 8 in the irradiation substrate 60a. Here, the stage 71b is sequentially moved in the X direction or the Y direction so that the laser beam Le scans the area to be irradiated from an end toward another end of the support substrate 8.

Here, in the scanning, the laser beams Lb to Le scan slightly narrower than the width of the area to be irradiated, so that the area to be irradiated slightly overlaps with the previous area to be irradiated.

Hence, the separation layer 9 above the support substrate 8 expands and contracts in a short period of time (in a pulse width of a laser), such that adhesion at an interface between the separation layer 9 and the resin substrate layer 10 decreases. Thus the organic EL display device 50a including the resin substrate layer 10 and the organic EL element 19a is delaminated from the irradiation substrate 60a. (See FIG. 13, for example.) Here, as illustrated in FIGS. 46 and 47, even though there is a scratch B horizontally extending on the surface of the support substrate 8, as seen in FIG. 46, and there is a linear non-irradiated area with the laser beams Lb and Lc in the separation layer 9, the non-irradiated area is irradiated with the laser beams Ld and Le, as seen in FIG. 47.

In this manner, the organic EL display device 50a of this embodiment may be produced.

Note that this embodiment describes a method for producing the organic EL display device 50a, using the laser beam emitting apparatus 80d. Instead, the light irradiation device 80c described in the above third embodiment may be used for the method for producing the organic EL display device 50a of this embodiment. Furthermore, this embodiment describes as an example a method for producing the organic EL display device 50a, the method which involves emitting a laser beam at the first to fourth angles at a different time. However, the laser beam may be simultaneously emitted at the first to fourth angles. Such a feature makes it possible to reduce a processing time required for the delaminating an element.

As described above, the production method of the organic EL display device 50a of this embodiment and a laser beam emitting apparatus to be used in the method may provide an effect (10) below, other than the above-described effects (1), (4) to (8), and (9).

Specifically describing on the effect (1), in the delaminating an element, the surface of the support substrate 8 in the irradiation substrate 60a is sequentially irradiated with the laser beams Lc, Ld, Lb, and Le. Thus, even though the extraneous matter A is found on the surface of the support substrate 8 and the non-irradiated area with the laser beam Lc is found on the separation layer 9, the non-irradiated area may be irradiated with the laser beams Ld, Lb, and Le. Such features make it possible to sufficiently supply the separation layer 9 with the energy of the laser beams Lb to Le, contributing to reducing faulty delamination of the organic EL display device 50a.

Specifically describing on (8), in the delaminating an element, the surface of the support substrate 8 in the irradiation substrate 60a is sequentially irradiated with the laser beams Lc, Ld, Lb, and Le respectively emitted at the first, second, third, and fourth angles. Hence, even though the extraneous matter A having a large area is found on the surface of the support substrate 8, such a feature may make a non-irradiated area with a laser beam harder to form, compared with the case where the laser beam emitting apparatus 80a of the first embodiment is used.

(10) In the delaminating an element, the surface of the support substrate 8 in the irradiation substrate 60a is sequentially irradiated with the laser beams Lc, Ld, Lb, and Le respectively emitted at the first, second, third, and fourth angles. Hence, even though there is a liner scratch B on the surface of the support substrate 8, such a feature may make a non-irradiated area with a laser beam harder to form, compared with the case where the laser beam Lc is emitted at the first angle and the laser beam Lb is emitted at the second angle in the above third embodiment.

Fifth Embodiment

Figure 48:
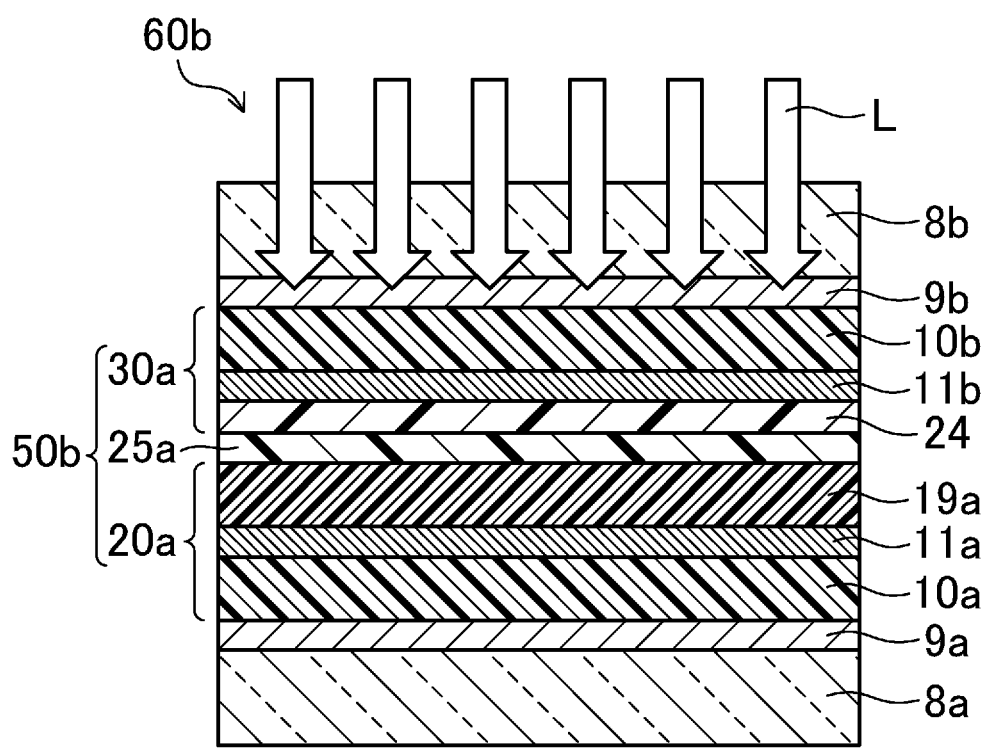
FIG. 48 is a first cross-sectional view illustrating a method for producing the organic EL display device according to a fifth embodiment of the present invention.
Figure 49:
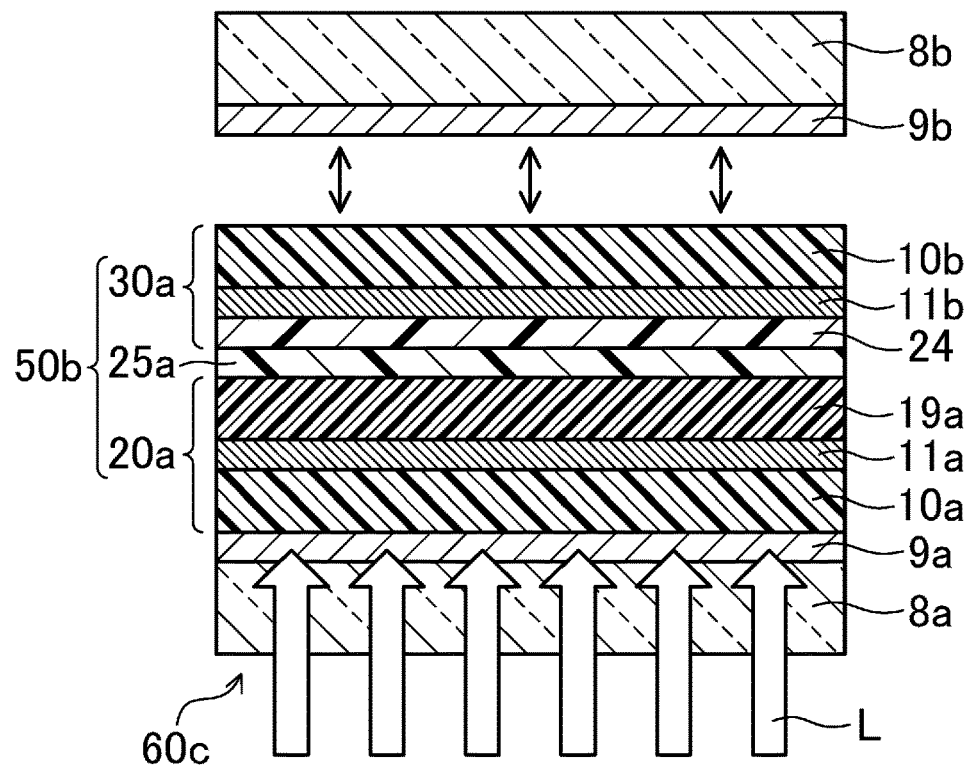
FIG. 49 is a second cross-sectional view illustrating the method for producing the organic EL display device according to the fifth embodiment of the present invention.
Figure 50:
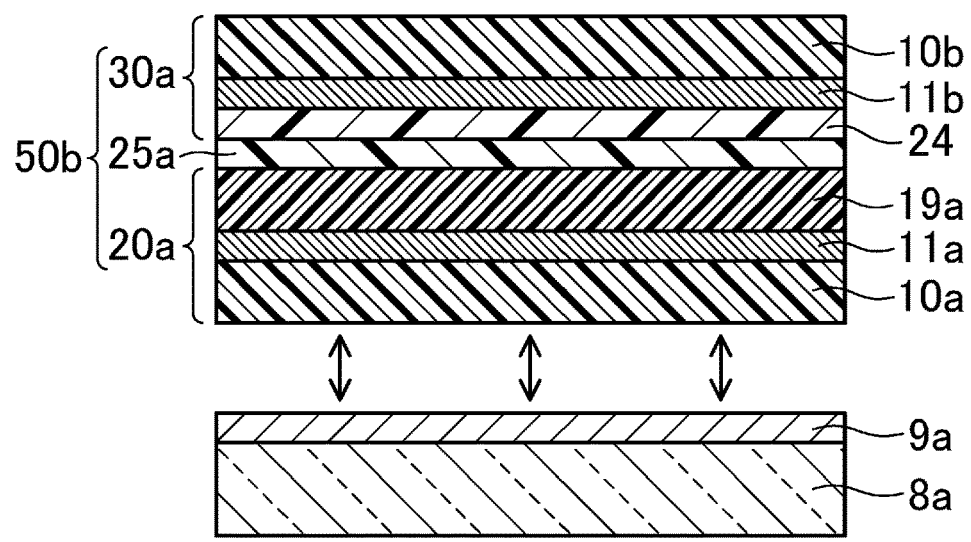
FIG. 50 is a third cross-sectional view illustrating the method for producing the organic EL display device according to the fifth embodiment of the present invention.

FIGS. 48 to 50 illustrate a fifth embodiment of a method for producing a thin-film element device according to the present invention, and a light irradiation device to be used in the method. Note that, in this embodiment, a method for producing an organic EL display device is described as an example of the method for producing a thin-film element device, and a laser beam emitting apparatus is described as an example of the light irradiation device to be used for the method. Here, FIGS. 48, 49, and 50 are the first, second, and third cross-sectional views illustrating the method for producing an organic EL display device of this embodiment.

The first to fourth embodiments describe as an example, a method for producing the organic EL display devices 50a having one resin substrate layer 10. This embodiment describes as an example an organic EL display device 50b having two resin substrate layers (a resin substrate layer 10a and a resin substrate layer 10b).

As illustrated in FIG. 50, the organic EL display device 50b includes: an element substrate 20a and a counter substrate 30a facing each other; a sealing material (not shown) having a frame shape and provided between the element substrate 20a and the counter substrate 30a; and a filler 25a provided in a region surrounded by the sealing material between the element substrate 20a and the counter substrate 30a. Here, in the organic EL display device 50b, a display region to display images is defined in a rectangular shape, and multiple pixels are arranged in a matrix in the display region. For example, each pixel includes sub-pixels arranged adjacent to each other. The sub-pixels include a sub-pixel for gradation display in red, a sub-pixel for gradation display in green, and a sub-pixel for gradation display in blue.

As illustrated in FIG. 50, the element substrate 20a includes: a first resin substrate layer 10a; a first base coat layer 11a provided above the first resin substrate layer 10a; and the organic EL element 19a provided above the first base coat layer 11a.

As illustrated in FIG. 50, the counter substrate 30a includes: a second resin substrate layer 10b; a second base coat layer 11b provided above the second resin substrate layer 10b; and a color filter layer 24 provided above the second base coat layer 11b.

The filler 25a functions as a getter (i.e., has the function of adsorbing oxygen, moisture, and other substances). Examples of materials for the filler 25a include epoxy resin and silicon resin which are thermosetting. Moreover, the filler 25a contains, for example, a metal oxide such as calcium oxide (CaO), barium oxide (BaO), and aluminum oxide (Al2O3), and active carbon, silica gel, and zeolite.

The sealing material is provided to bond a peripheral portion of the element substrate 20a to a peripheral portion of the counter substrate 30a. Examples of materials for the sealing material include epoxy resin, acrylic resin, polyimide resin, and phenol resin which are UV curable and/or thermosetting.

The resin substrate layers 10a and 10b are substantially the same as the resin substrate layer 10 described in the above first embodiment.

The base coat layers 11a and 11b are substantially the same as the base coat layer 11 described in the above first embodiment.

The color filter layer 24 includes, for example, a black matrix (not shown) formed in a grid pattern, and multiple coloring layers (not shown), such as a red layer, a green layer, and a blue layer, each provided in a grid of the black matrix to correspond to one of sub pixels.

The above organic EL display device 50b is flexible, and displays an image when the light-emitting layer 3 of the organic EL layer 16 appropriately emits light in each sub-pixel via the TFT 12.

Described next is a method for producing the organic EL display device 50b according to this embodiment. Note that the method for manufacturing the organic EL display device 50b of this embodiment includes: preparing a panel including forming an element; and delaminating the element.

<Preparing Panel>

First, as illustrated in FIG. 48, a first separation layer 9a, having a thickness ranging approximately from 100 nm to 300 nm, is formed on a surface of a first support substrate 8a such as a glass substrate. An example of the first separation layer 9a is either (i) one of a metal film containing molybdenum (Mo), tantalum (Ta), tungsten (W), or titan (Ti), an alloy film, an oxide film, or a nitride film containing these metals and deposited by sputtering, or (ii) an amorphous silicon film deposited by CVD.

Then, polyimide resin is applied on a surface of the first separation layer 9a by, for example, spin coating or slit coating. After that, a film of the applied polyimide resin is baked to form a first resin substrate layer 10a having a thickness ranging approximately from 5 µm to 20 µm as illustrated in FIG. 48.

Furthermore, a film such as a silicon oxide film or a silicon nitride film, having a thickness ranging approximately from 50 nm to 1000 nm, is deposited on a surface of the first resin substrate layer 10a by, for example, CVD to form a first base coat layer 11a as illustrated in FIG. 48.

After that, the TFTs 12, the interlayer insulation film 13, the first electrodes 14, the edge cover 15, the organic EL layers 16 (each including the positive hole injection layer 1, the positive hole transport layer 2, the light-emitting layer 3, the electron transport layer 4, and the electron injection layer 5), the second electrode 17, and the sealing film 18 are formed on a surface of the first base coat layer 11a, using a well-known technique to form the organic EL element 19a as illustrated in FIG. 48.

In this manner, the element substrate 20a is prepared above the first support substrate 8a via the first separation layer 9a.

Moreover, as illustrated in FIG. 48, a second separation layer 9b, having a thickness ranging approximately from 100 nm to 300 nm, is formed on a surface of a second support substrate 8b such as a glass substrate. An example of the first separation layer 9b is either (i) one of a metal film containing molybdenum (Mo), tantalum (Ta), tungsten (W), or titan (Ti), an alloy film, an oxide film, or a nitride film containing these metals and deposited by sputtering, or (ii) an amorphous silicon film deposited by CVD.

Then, polyimide resin is applied on a surface of the second separation layer 9b by, for example, spin coating or slit coating. After that, a film of the applied polyimide resin is baked to form the second resin substrate layer 10b having a thickness ranging approximately from 5 µm to 20 µm as illustrated in FIG. 48.

Furthermore, a film such as a silicon oxide film or a silicon nitride film, having a thickness ranging approximately from 50 nm to 1000 nm, is deposited on a surface of the second resin substrate layer 10b by, for example, CVD to form the second base coat layer 11b as illustrated in FIG. 48.

After that, as illustrated in FIG. 48, the color filter layer 24 is formed on a surface of the second base coat layer 11b, using a well-known technique.

In this manner, the counter substrate 30a is prepared above the second support substrate 8b via the second separation layer 9b.

Furthermore, a sealing resin is applied in a frame shape to a surface of the element substrate 20a prepared above the first support substrate 8a by, for example, the dispending method, and a filler resin is dripped and placed inside the sealing resin.

Subsequently, the element substrate 20a on which the sealing resin and the filler resin have been arranged is bonded to the counter substrate 30a prepared below the second support substrate 8b in a reduced-pressure atmosphere. Thereafter, the reduced-pressure atmosphere is released, thereby applying a pressure to the outer surfaces of the first support substrate 8a and the second support substrate 8b.

Moreover, for example, the sealing resin sandwiched between the element substrate 20a and the counter substrate 30a is irradiated with UV. Thereafter, the sealing resin and the filler resin are cured with heat, thereby forming a sealing material and the filler 25a.

In this manner, the irradiation substrate 60b (see FIG. 48) may be prepared.

<Delaminating Element>

First, using any one of the light irradiation devices 80a to 80e used in the first to fourth embodiments, the laser beam L is emitted, from the second support substrate 8b side, from different directions as illustrated in FIG. 48, such that adhesion at an interface between the second separation layer 9b and the second resin substrate layer 10b decreases. Thus, the irradiation substrate 60c including the organic EL display device 50b is delaminated from the irradiation substrate 60b. (See FIG. 49.)

Then, using any one of the light irradiation devices 80a to 80e used in the first to fourth embodiments, the laser beam L is emitted, from different directions, from the first support substrate 8a side of the irradiation substrate 60c as illustrated in FIG. 49, such that adhesion at an interface between the first separation layer 9a and the first resin substrate layer 10a decreases. Thus, the organic EL display device 50b is delaminated from the irradiation substrate 60c as illustrated in FIG. 50.

In this manner, the organic EL display device 50b of this embodiment may be produced.

As described above, the production method of the organic EL display device 50b of this embodiment and a laser beam emitting apparatus to be used in the method may provide the above effects (1) to (10).

Note that this embodiment describes as an example a method for producing the organic EL display device 50b including the color filter layer 24; however, the color filter layer 24 may be omitted.

Sixth Embodiment

Figure 51:
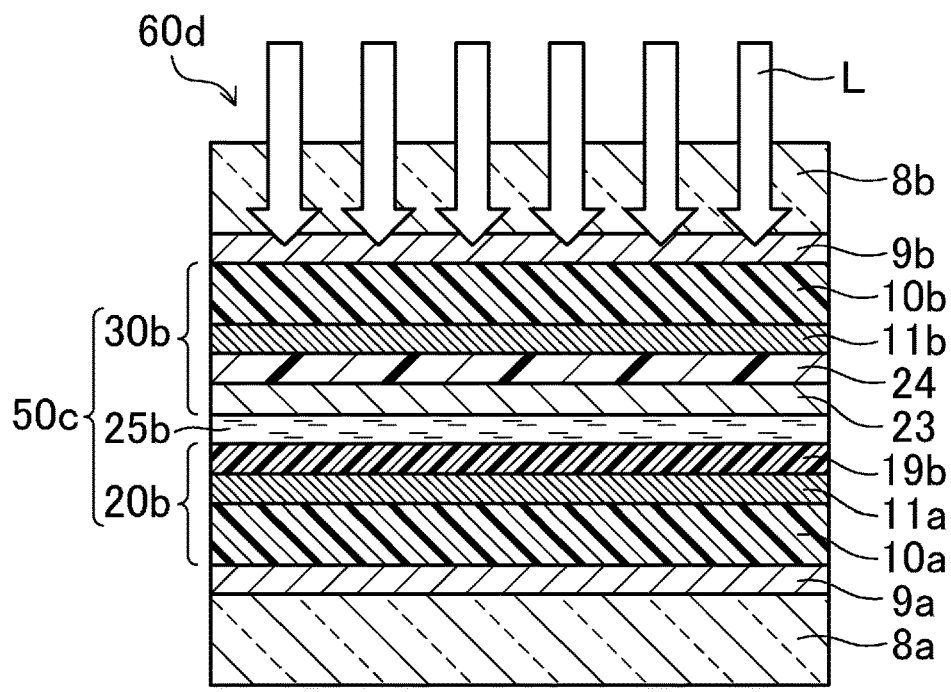
FIG. 51 is a first cross-sectional view illustrating a method for producing a liquid crystal display device according to a sixth embodiment of the present invention.
Figure 52:
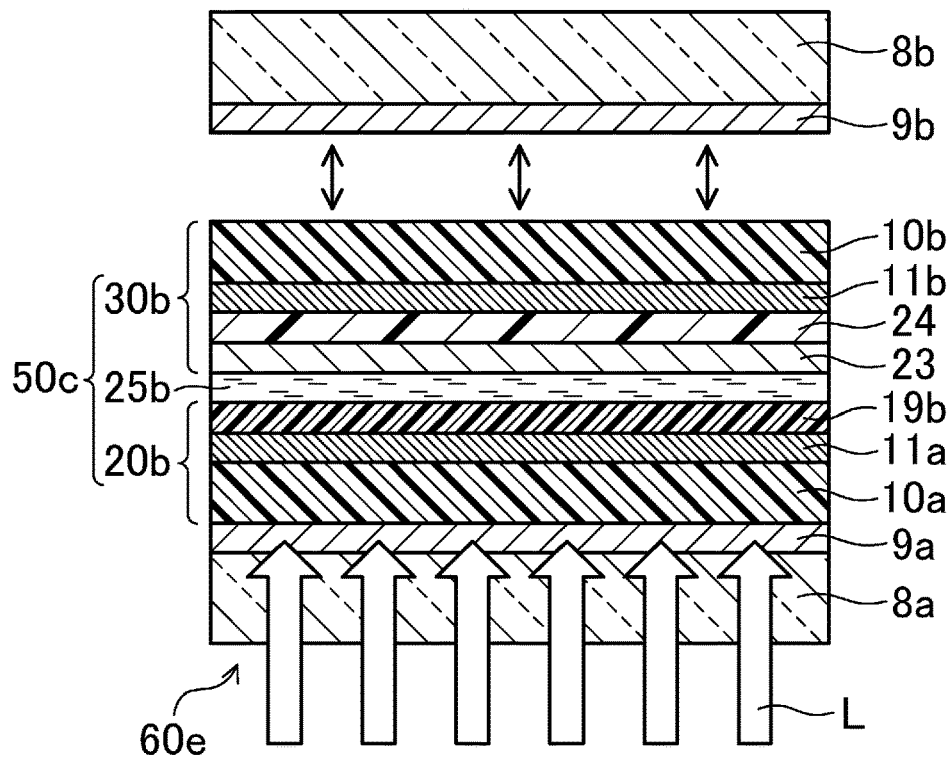
FIG. 52 is a second cross-sectional view illustrating the method for producing the liquid crystal display device according to the sixth embodiment of the present invention.
Figure 53:
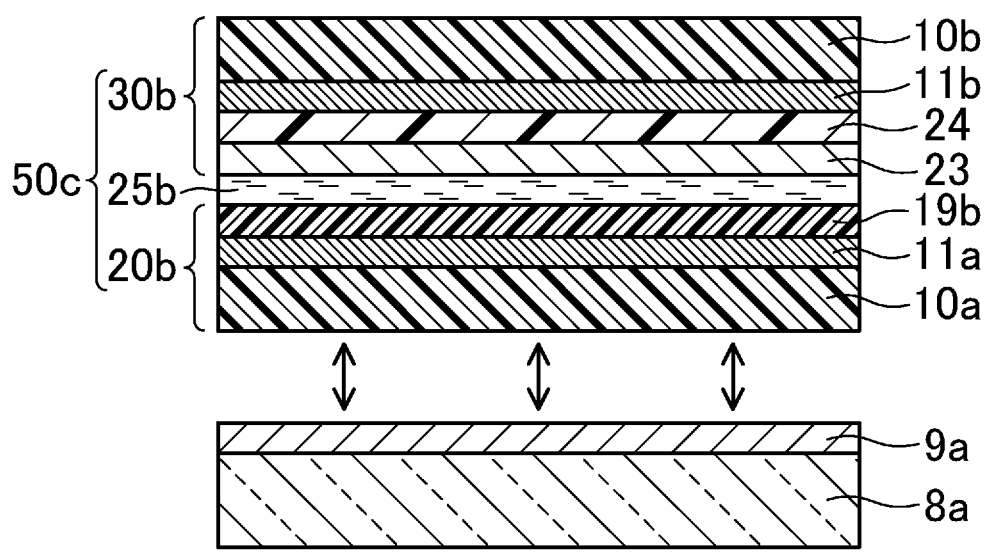
FIG. 53 is a third cross-sectional view illustrating the method for producing the liquid crystal display device according to the sixth embodiment of the present invention.

FIGS. 51 to 53 illustrate a sixth embodiment of a method for producing a thin-film element device according to the present invention, and a light irradiation device to be used in the method. Note that, in this embodiment, a method for producing a liquid crystal display device is described as an example of the method for producing a thin-film element device, and a laser beam emitting apparatus is described as an example of the light irradiation device to be used for the method. Here, FIGS. 51, 52, and 53 are the first, second, and third cross-sectional views illustrating the method for producing a liquid crystal display device 50c of this embodiment.

The first to fifth embodiments describe as an example a method for producing the organic EL display devices 50a. This embodiment describes as an example a method for producing the liquid crystal display device 50c.

As illustrated in FIG. 53, the liquid crystal display device 50c includes: an element substrate 20b and a counter substrate 30b facing each other; a sealing material (not shown) having a frame shape and provided between the element substrate 20b and the counter substrate 30b; and a liquid crystal layer 25b provided in a region surrounded by the sealing material between the element substrate 20b and the counter substrate 30b. Here, in the liquid crystal display device 50c, for example, a display region to display images is defined in a rectangular shape, and multiple pixels are arranged in a matrix in the display region. For example, each pixel includes sub-pixels arranged adjacent to each other. The sub-pixels include a sub-pixel for gradation display in red, a sub-pixel for gradation display in green, and a sub-pixel for gradation display in blue.

As illustrated in FIG. 53, the element substrate 20b includes: the first resin substrate layer 10a; the first base coat layer 11a provided above the first resin substrate layer 10a; and a TFT array element 19b provided above the first base coat layer 11a.

The TFT array element 19b includes, for example, multiple TFTs (the TFTs 12: see FIG. 1), an interlayer insulation film (the interlayer insulation film 13: see FIG. 1), multiple pixel electrodes, and multiple alignment films. These features are provided above the first base coat layer 11a in the stated order. Here, the pixel electrodes are arranged in a matrix above the interlayer insulating film (13) such that each pixel electrode corresponds to an associated one of the sub-pixels. Moreover, the pixel electrodes are connected to corresponding drain electrodes of the TFTs (12) via contact holes formed in the interlayer insulating film (13). Furthermore, the pixel electrodes are transparent conductive films containing, for example, Indium Tin Oxide (ITO). In addition, the alignment films of the TFT array element 19b and the counter substrate 30b are, for example, polyimide resin.

As illustrated in FIG. 53, the counter substrate 30b includes: the second resin substrate layer 10b; and the second base coat layer 11b, a color filter layer 24, a common electrode 23, and an alignment film (not shown) provided above the second resin substrate layer 10b in the stated order. Here, the common electrode 23 is a transparent conductive film containing, for example, ITO.

A liquid crystal layer 25b contains a nematic liquid crystal material having an electrooptic property.

The above liquid crystal display device 50c is flexible, and displays an image when, in each of the sub-pixels, a predetermined voltage is applied to the liquid crystal layer 25b provided between the pixel electrodes above the element substrate 20b and the common electrode 23 above the counter substrate 30 via the TFTs (12) to change an orientation of the liquid crystal layer 25b and, for example, adjust a transmissivity of light from a backlight.

Described next is a method for producing the liquid crystal display device 50c according to this embodiment. Note that the method for manufacturing the liquid crystal display device 50c of this embodiment includes: preparing a panel including forming an element; and delaminating the element.

<Preparing Panel>

As illustrated in FIG. 51, using a well-known technique, the TFTs (12), the interlayer insulation film (13), the pixel electrodes, and the alignment film are formed as the TFT array element 19b on the surface of the first base coat layer 11a formed in the preparing the panel in the fifth embodiment. In this manner, the element substrate 20b is prepared above the first support substrate 8a via the first separation layer 9a.

As illustrated in FIG. 51, using a well-known technique, the color filter layer 24, the common electrode 23, and the alignment film are formed on the surface of the second base coat layer 11b formed in the preparing the panel in the fifth embodiment. In this manner, the counter substrate 30b is prepared above the second support substrate 8b via the second separation layer 9b.

Furthermore, a sealing resin is applied in a frame shape to a surface of the element substrate 20b prepared above the first support substrate 8a by, for example, the dispending method, and a liquid crystal material is dripped and placed inside the sealing resin.

Subsequently, the element substrate 20b on which the sealing resin and the filler resin have been arranged is bonded to the counter substrate 30b prepared below the second support substrate 8b in a reduced-pressure atmosphere. Thereafter, the reduced-pressure atmosphere is released, thereby applying a pressure to the outer surfaces of the first support substrate 8a and the second support substrate 8b.

Moreover, for example, the sealing resin sandwiched between the element substrate 20b and the counter substrate 30b is irradiated with UV. Thereafter, the sealing resin is cured with heat, thereby forming a sealing material and the liquid crystal layer 25b.

In this manner, the irradiation substrate 60d (see FIG. 51) may be prepared.

<Delaminating Element>

First, using any one of the light irradiation devices 80a to 80e used in the first to fourth embodiments, the laser beam L is emitted, onto the second support substrate 8b, from different directions as illustrated in FIG. 51, such that adhesion at an interface between the second separation layer 9b and the second resin substrate layer 10b decreases. Thus, the irradiation substrate 60e including the liquid crystal display device 50c is delaminated from the irradiation substrate 60d. (See FIG. 52.)

Then, using any one of the light irradiation devices 80a to 80e used in the first to fourth embodiments, the laser beam L is emitted, from different directions, onto the first support substrate 8a of the irradiation substrate 60e as illustrated in FIG. 52, such that adhesion at an interface between the first separation layer 9a and the first resin substrate layer 10a decreases. Thus, the liquid crystal display device 50c is delaminated from the irradiation substrate 60e as illustrated in FIG. 53.

In this manner, the organic EL display device 50c of this embodiment may be produced.

As described above, the production method of the liquid crystal display device 50c of this embodiment and a laser beam emitting apparatus to be used in the method may provide the above effects (1) to (6) and (8) to (10).

Note that the above first to fifth embodiments describe, as an example, an organic EL layer as a layer having a stack structure of the five layers, namely, a positive hole injection layer, a positive hole transport layer, a light-emitting layer, an electron transport layer, and an electron injection layer. However, the organic EL layer may have a stack structure of three layers including a positive hole injection and transport layer, a light-emitting layer, and an electron transport and injection layer, for example.

Each of the above embodiments describes, as an example, an organic EL display device in which a first electrode functions as an anode and a second electrode functions as a cathode. However, the present invention is applicable to an organic EL display device which has an inverted stack structure to have the first electrode functioning as the cathode and the second electrode functioning as the anode.

Each of the above embodiments describes, as an example, an organic EL display device or a liquid crystal display device including an element substrate in which an electrode of TFTs connected to a first electrode is denoted as a drain electrode. However, the present invention is applicable to an organic EL display device or a liquid crystal display device including an element substrate in which an electrode of TFTs connected to the first electrode is called a source electrode.

Each of the above embodiments describes, as an example, an organic EL display device or a liquid crystal display device as a thin-film element device. However, the present invention may be applicable to a thin-film element device such as an X-ray image sensor.

INDUSTRIAL APPLICABILITY

As described above, the present invention is useful for a flexible display device.

DESCRIPTION OF REFERENCE CHARACTERS

La to Le Laser Beam
S Rotating Shaft
8, 8a, 8b Support Substrate
9, 9a, 9b Separation Layer
10, 10a, 10b Resin Substrate Layer
11, 11a, 11b Base Coat Layer
19a Organic EL Element (Thin-Film Element)
19b TFT Array Element (Thin-Film Element)
22 Support
50a, 50b Organic EL Display Device (Thin-Film Element Device)
50c Liquid Crystal Display Device (Thin-Film Element Device)
60a to 60e Irradiation Substrate
71a to 71e Stage
72, 72a to 72c Emitting Head
80a to 80e Laser Beam Emitting Apparatus

The invention claimed is:

1. A method for producing a thin-film element device, the method comprising steps of:
(a) forming a substrate layer above a support substrate which is transparent, and then a thin-film element above the substrate layer; and
(b) emitting a laser beam to a face of the support substrate opposite to another face of the support substrate to which the substrate layer and the thin-film element are formed, and delaminating the substrate layer and the thin-film element from the support substrate, wherein
in step (b), the laser beam is emitted from a first direction and a second direction which is different from the first direction.

2. The method of claim 1, wherein
in step (b), the laser beam is simultaneously emitted from the first direction and the second direction.

3. The method of claim 1, wherein
in step (b), the laser beam is emitted from the first direction and the second direction at a different time.

4. The method of claim 1, wherein
the first direction is perpendicular to a surface of the support substrate, and the second direction is at an oblique angle to the surface of the support substrate.

5. The method of claim 4, wherein
in step (b), the laser beam is moved and emitted perpendicularly to, and at the oblique angle to, the surface of the support substrate, and the surface of the support substrate is irradiated perpendicularly and then at the oblique angle with the laser beam.

6. The method of claim 5, wherein
the laser beam at the oblique angle to the surface is lower in intensity than the laser beam perpendicular to the surface.

7. The method of claim 1, wherein
the first direction and the second direction are at an oblique angle to the surface of the support substrate.

8. The method of claim 1, wherein
in step (a), a separation layer is formed between the support substrate and the substrate layer.

9. The method of claim 1, wherein
in step (a), a base coat layer is formed between the thin-film element and the substrate layer.

10. The method of claim 1, wherein
in step (a), the thin-film element is formed, and then, a support is attached to a surface of the thin-film element.

11. The method of claim 1, wherein
the thin-film element is an organic EL element.

12. A method for producing a thin-film element device, the method comprising steps of:
(a) forming a substrate layer above a support substrate which is transparent, and then a thin-film element above the substrate layer; and
(b) emitting a laser beam to a face of the support substrate opposite to another face of the support substrate to which the substrate layer and the thin-film element are formed, and delaminating the substrate layer and the thin-film element from the support substrate, wherein
in step (b), the laser beam is emitted at a first angle, a second angle, a third angle, and a fourth angle to the surface of the support substrate, the first angle, the second angle, the third angle, and the fourth angle being at 90° apart from each other in a planar view.

13. The method of claim 12, wherein
in step (b), the laser beam is simultaneously emitted from the first angle, the second angle, the third angle, and the fourth angle.

14. The method of claim 12, wherein
in step (b), the laser beam is emitted at the first angle, the second angle, the third angle, and the fourth angle at a different time.

15. The method of claim 12, wherein
in step (a), a separation layer is formed between the support substrate and the substrate layer.

16. The method of claim 12, wherein
in step (a), a base coat layer is formed between the thin-film element and the substrate layer.

17. The method of claim 12, wherein
in step (a), the thin-film element is formed, and then, a support is attached to a surface of the thin-film element.

18. The method of claim 12, wherein
the thin-film element is an organic EL element.

* * * * *